United States Patent
Kamiyama et al.

(10) Patent No.: US 6,340,501 B1
(45) Date of Patent: Jan. 22, 2002

(54) DEVICE AND METHOD FOR MANUFACTURING AN OPTICAL RECORDING MEDIUM

(75) Inventors: Toshifumi Kamiyama, Tsuyama; Toshiaki Kunieda, Minoo; Sadayuki Okazaki, Hirakata, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/423,249

(22) PCT Filed: May 7, 1998

(86) PCT No.: PCT/JP98/02020

§ 371 Date: Apr. 5, 2000

§ 102(e) Date: Apr. 5, 2000

(87) PCT Pub. No.: WO98/50916

PCT Pub. Date: Nov. 12, 1998

(30) Foreign Application Priority Data

May 8, 1997 (JP) .......................... 09-117864
Oct. 2, 1997 (JP) .......................... 09-269563

(51) Int. Cl.$^7$ .................. C23C 14/12; C23C 14/24; C23C 14/34; C23C 14/56; C23C 16/54
(52) U.S. Cl. .................. 427/255.6; 427/255.7; 427/250; 427/251; 427/248.1; 118/715; 118/723 VE; 118/726; 118/727; 118/728; 118/729
(58) Field of Search .................. 427/162, 248.1, 427/250, 251, 255.28, 255.5, 255.6, 255.7, 8–10; 369/275.1; 118/50, 715, 719, 728, 729, 730, 733, 726, 727, 723 VE

(56) References Cited

U.S. PATENT DOCUMENTS

| | | | | |
|---|---|---|---|---|
| 3,552,352 A | * | 1/1971 | McConnell | 118/49.5 |
| 4,592,306 A | * | 6/1986 | Gallego | 118/719 |
| 4,803,947 A | * | 2/1989 | Ueki et al. | 418/719 |
| 5,293,373 A | | 3/1994 | Toide et al. | |
| 5,512,320 A | * | 4/1996 | Turner et al. | 427/255 |
| 5,525,379 A | * | 6/1996 | Takada et al. | 427/571 |
| 5,616,208 A | | 4/1997 | Lee | |
| 5,770,293 A | * | 6/1998 | Raychaudhuri et al. | 428/64.1 |

FOREIGN PATENT DOCUMENTS

| | | | |
|---|---|---|---|
| EP | 0 381 278 | | 8/1990 |
| EP | 0 619 576 | | 10/1994 |
| JP | 60159167 A | * | 8/1985 |
| JP | 61-64880 | | 4/1986 |
| JP | 61064880 | * | 4/1986 |
| JP | 62-229550 | | 10/1987 |
| JP | 3-20731 | | 1/1991 |
| JP | 03132391 A | * | 6/1991 |
| JP | 4-54032 | | 5/1992 |
| JP | 4-337536 | | 11/1992 |
| JP | 5-271913 | | 10/1993 |
| JP | 5314540 | * | 11/1993 |
| JP | 5-314540 | | 11/1993 |
| JP | 6-342535 | | 12/1994 |
| JP | 9-7237 | | 1/1997 |
| JP | 9007237 | * | 1/1997 |

* cited by examiner

Primary Examiner—Shrive P. Beck
Assistant Examiner—Wesley Markham
(74) Attorney, Agent, or Firm—Wenderoth, Lind & Ponack, L.L.P.

(57) ABSTRACT

A manufacturing device of an optical recording medium having a plurality of recording layers formed on a substrate is provided. The manufacturing device includes a vacuum pre-treatment chamber (52), a plurality of recording layer forming chambers (54, 56) each for forming a recording layer by vapor-depositing an organic pigment material, a reflective layer forming chamber (58), and a vacuum post-treatment chamber (60). Each of the recording layer forming chambers has at least one recording layer forming unit (84, 86), and the reflective layer forming chamber has at least one reflective layer forming unit (88).

31 Claims, 16 Drawing Sheets

DEVICE AND METHOD FOR MANUFACTURING AN OPTICAL RECORDING MEDIUM

FIELD OF THE INVENTION

The present invention relates to a manufacturing method and a manufacturing device for an optical recording medium having a high density, onto and from which information can be recorded and reproduced by using a laser beam, and more particularly concerns a manufacturing method and a manufacturing device for an optical recording medium capable of recording only once; that is, a so-called write-once type optical recording medium or an optical recording medium, such as CD-Rs and DVD-Rs.

BACKGROUND ART

In recent years, optical recording media have been widely used because of their high information density and ease in retrieving data. In particular, CD-Rs, which have a large capacity (650 MB) and are of comparatively low cost, have recently been extensively used. An explanation will be given of manufacturing methods and products of the optical recording media.

FIG. 1 is a schematic cross-sectional view, taken perpendicularly to the round face of a disk, of a conventional manufacturing device for forming a recording layer of a write-once type optical recording medium. This device is referred to as a spin coater.

In this Figure, reference numeral 10 is a spin coater main body, 12 is a substrate for the optical recording medium, 14 is a spindle shaft, 16 is a spindle table, 18 is an application nozzle for a recording layer solution, 20 is an organic pigment solution of a recording layer material, and 22 is a spindle motor. The organic pigment solution of the recording layer material 20 is supplied onto the optical recording medium substrate 12 through the nozzle 18. Thereafter, when the spindle motor 22 rotates in the direction of the arrow 24, the optical recording medium substrate 12 on the spindle table 16 is allowed to rotate at the same time, and the solution of the recording layer material 20 expands in the direction of the arrow 26 so that the solution of the recording layer material 20 is applied onto the optical recording medium substrate 12 with a uniform thickness. The organic pigment contained in the solution of the recording layer material 20 is made of a material such as a phthalocyanine pigment and a cyanine pigment.

FIG. 2 schematically shows a cross-sectional structure, taken perpendicularly to the round face of the disk, of one portion of an optical recording medium manufactured by the above-mentioned manufacturing method. In this Figure, reference numeral 28 is a minute groove provided on the surface of the optical recording medium substrate 12, 30 is a recording layer, 32 is a reflective layer, and 34 is a protective layer. When the solution of the recording layer material is applied as described above, the solution of the recording layer material fills the minute groove 28 of the optical recording medium substrate made of polycarbonate. The solution that has been applied is dried; and thus, the recording layer is formed. The minute groove 28 is of a spiral form extending from the inner circumference of the optical recording medium substrate 12 to the outer circumference thereof.

When information is recorded on such an optical recording medium as described above, a laser beam spot 36 is irradiated onto the groove 28 from a recording device so that the pigment material of the recording layer is decomposed and/or modified, or in some cases, the substrate 12 is deformed by heat generated at this time, with the result that a pit 38 is formed.

Upon irradiation of a reproducing laser beam with an output power lower than that of the recording laser beam, the reproducing laser beam is allowed to be reflected by the reflective layer 32 formed by sputtering gold or silver. However, compared with portions that have not been subjected to the laser beam at the time of recording, the light reflection coefficient of the pit 38 is lower so that this contrast due to the difference between the reflection coefficients indicates the presence of a signal. With this mechanism, the same signal output as that of the CD disk standardized by the Red book is obtained, so that the signal is identified as a CD one. The contents explained here are the same as those standardized for the write-once optical recording medium of the CD-R in the Orange book.

DISCLOSURE OF THE INVENTION

Although the manufacture of the optical recording medium by the use of the above-mentioned spin coater is comparatively simple, this method has various problems.

First, the characteristics of the organic pigment solution of the recording layer material 20 (for example, viscosity, etc.) are highly susceptible to external factors (for example, temperature, moisture, etc.), and the applied states of the solution are not the same between the inner circumference and the outer circumference of the optical recording medium depending on the number of revolutions of the spin coater and the controlled states of the number of revolutions. This results in the film thickness of the applied solution tending to have a difference between the inner circumference and the outer circumference of the optical recording medium; and therefore, it is not easy to form a recording layer having a uniform film thickness over the substrate.

Moreover, the organic pigment solution of the recording layer material 20 is applied by using various solvents, and in general, it is necessary to sufficiently dry the solution after having been coated. Since this drying process takes a long time, it is difficult to form the recording layer in a short time with high yield, which has been a problem in reducing the production costs of the optical recording medium.

In addition, as demands for high density of the optical recording media have increased, applicability to a short wavelength laser beam (for example, 650 nm) has been demanded, and various demands, such as, for example, capability of reproducing information by a DVD player (that is, compatibility with DVD players), which information has been recorded by using a long wavelength (780 nm in the case of CDs), and improvements of the organic pigment suitable for shortened wavelengths of the laser beam, are presented. Thus, methods such as the use of laminated organic pigment layers have been proposed.

However, the above-mentioned spin coat method has a problem in which a layer that has been first applied tends to be damaged by a solution of a recording layer material that is applied later at the time of rotation at high speeds. Moreover, size reduction of the pitch between grooves has been proposed in order to achieve the high density.

The above-mentioned conventional method has a limitation in its capability for solving these problems.

The present invention provides a manufacturing device of an optical recording medium for solving the above-mentioned problems. Specifically, the present invention provides a device for manufacturing an optical recording medium comprising a plurality of recording layers on a substrate, which device comprises a vacuum pre-treatment chamber, a plurality (at least two) of recording layer forming a chambers each for forming a recording layer by vapor deposition, a reflective layer forming chamber and a vacuum post-treatment chamber. Each recording layer forming chamber is provided with at least one recording layer forming unit, and the reflective layer forming chamber is provided with at least one reflective layer forming unit.

The optical recording medium manufacturing device of the present invention further comprises a substrate transporting mechanism, and this mechanism transports the substrate between chambers in the device. Therefore, by the substrate transporting mechanism, the substrate for the optical recording medium, which has been carried into the vacuum pre-treatment chamber inside the device, is transported from the vacuum pre-treatment chamber, through the recording layer forming chambers and the reflective layer forming chamber, to the vacuum post-treatment chamber, and discharged from the vacuum post-treatment chamber.

As will be described later, for example, in an embodiment in which the respective chambers are adjacent to each other, the substrate can be transported from one chamber to another chamber adjacent thereto inside the device. Moreover, in another embodiment in which the respective chambers are placed on the periphery of a rotary chamber, the substrate can be transported from one chamber inside the device to any chamber inside the device through the rotary chamber. In either of the embodiments, such a transporting process of the substrate is carried out by the substrate transporting mechanism.

Furthermore, the substrate transporting mechanism is preferably designed so as to transport the substrate for the optical recording medium from the outside of the optical recording medium manufacturing device into the vacuum pre-treatment chamber, and also to transport the substrate from the inside of the vacuum post-treatment chamber to the outside of the optical recording medium manufacturing device.

Moreover, the present invention also provides a method for manufacturing the optical recording medium by using the above-mentioned manufacturing device for the optical recording medium of the present invention. In other words, in the method for manufacturing the optical recording medium of the present invention that uses the optical recording medium manufacturing device having a vacuum pre-treatment chamber (or vacuum front chamber), a plurality (at least two) of recording layer forming chambers, a reflective layer forming chamber and a vacuum post-treatment chamber (or vacuum rear chamber), the substrate is loaded into the device from the outside thereof, allowed to pass through these chambers, and taken out of the device so that a plurality of recording layers are formed on the substrate by vapor deposition and a reflective layer is also formed on these recording layers. The transportation of the substrate inside the device is performed by using the substrate transporting mechanism. In a preferred embodiment, the loading operation of the substrate into the device and the discharging operation of the substrate from the device are also carried out by the substrate transporting mechanism.

In the above-mentioned device and method, the "substrate" maybe a substrate for an optical recording medium itself or a substrate holder supporting a plurality of such substrates.

The following description will explain various features of the present invention in association with various elements constituting the device of the present invention, and the explanations also apply to the method of the present invention, as well as to the device used in the method.

In accordance with the present invention, an optical recording medium comprising a substrate and a plurality of recording layers laminated thereon by vapor deposition is obtained by using only a single device; and these recording layers have an improved uniform thickness as compared with the formation of the recording layers by the use of the above-mentioned spin coater. The optical recording medium obtained by the present invention includes a plurality of the recording layers so that different or novel optical characteristics (for example, the spectral reflection coefficient characteristics with respect to the entire substrate), which have not been achieved by the conventional recording medium having only a single recording layer, can now be obtained.

For example, the optical recording medium obtained according to the present invention has a comparatively small spectral absorption coefficient not only to a light beam having a wavelength suitable for CDs (for example, 780 nm to 830 nm), but also to a light beam having a shorter wavelength (for example, 620 nm to 690 nm suitable for DVDs); and therefore, the optical recording medium obtained by the present invention is capable of dealing with two kinds of wavelengths (for example, CD-use wavelengths and DVD-use wavelengths).

The optical recording medium obtained by the device or the method of the present invention is provided with a plurality of the recording layers as described above so that unrecorded portions (that is, portions not irradiated with a recording laser beam) exhibit the different or novel optical characteristics as described above. Moreover, in recorded portions (that is, portions irradiated with the recording laser beam), at least one of the recording layers is allowed to mainly function as its inherent recording layer in the optical recording medium so that the pigment material forming the recording layer is decomposed and/or modified by the irradiation of the laser beam, resulting in a change in the optical characteristic of the recording layer, while the other recording layer(s) exhibit an assisting function for aiding such a change in the optical characteristic (which may be referred to as a recording assist layer). In some cases, of course, all the recording layers are decomposed and/or modified by the recording laser beam so that all the layers have both of the functions as the recording layer and the recording assist layer. It is difficult to clearly distinguish the functions of these recording layers and recording assist layers, and the plurality of recording layers are integrally allowed to exhibit a novel or different optical characteristic by the synergistic effect. From this point of view, in the present description, although all the layers formed in the recording layer forming chambers are referred to as "recording layers" for convenience of explanation, in addition to the so-called recording layer (the recording layer used in a normal optical recording medium), these recording layers include various layers functioning as recording assist layers for aiding the function of the recording layer, such as a filter layer and an enhance layer.

In the device of the present invention, since a reflective layer is formed after the formation of the recording layers, the time required for manufacturing the optical recording medium can be shortened. Furthermore, as will be described later, the device can manufacture the optical recording medium more efficiently by using a film-thickness measuring device, a shutter mechanism installed between the substrate and the recording layer forming unit (more preferably, combined with the film-thickness measuring mechanism), a rotation/rotation-revolution mechanism for the substrate, a mechanism for changing the positional relationship between the substrate and the recording layer forming unit (more preferably, combined with the film-thickness measuring mechanism), and a substrate transporting mechanism using a single-hand robot.

FIG. 3 schematically shows the optical recording medium thus manufactured in a cross-sectional view in the same manner as in FIG. 2. The optical recording medium 40 comprises a substrate 41 for the optical recording medium made of a material such as a polycarbonate, a plurality of recording layers 43 and 44 containing organic pigment materials laminated on the substrate 41, a reflective layer 45 formed on the recording layers, and a protective layer 46 formed on the reflective layer. The substrate 41 is provided with spiral grooves 42 formed on one surface thereof. The organic pigment materials forming the recording layers are desirably selected from, for example, phthalocyanine materials. In the device of the present invention, the recording layers 43 and 44 and the reflective layer 45 (that is, a portion 49) are formed on the substrate 41.

With respect to the material of the substrate 41 not being particularly limited, any material that is applied to a commonly-used optical recording medium and has a transmitting property with respect to laser light used for the optical recording medium is adopted. For example, plastic materials such as a polycarbonate and an acrylic resins are used.

With respect to the reflective layer 45, any material such as gold, silver or aluminum, may be used as long as it has a predetermined reflection coefficient, and those materials generally used for the reflective layer of the optical recording medium can be used in the present invention.

With respect to the protective layer 46, in the same manner as the reflective layer, a UV setting resin generally used for the optical recording medium may be used, and the resin is applied on the recording layer and set so as to form the resin layer. The protective layer is formed by applying and setting the resin after the recording layers and the reflective layer have been formed on the substrate in accordance with the present invention. A generally used protective-layer forming device may of course be combined with the device of the present invention.

FIG. 4 shows the results of measurements of the thickness of the recording layer of the optical recording medium manufactured by the vapor deposition in this manner. For the recording layer, a phthalocyanine compound was used as the pigment material, and the pigment material was heated to 150 to 250° C. and evaporated under a condition of not more than $1 \times 10^{-3}$ torr, and vapor thereof was deposited on the substrate. After the recording layer had been formed on the substrate, the thickness of the recording layer was measured at predetermined portions by using a film thickness measuring device.

In FIG. 4, the axis of abscissa represents the radius of an optical recording medium having a diameter of 120 mm, and the axis of ordinate indicates the thickness of the recording layer. The solid line shows the film thickness of the recording layer formed by vapor deposition in accordance with the present invention at a radius position of 25 mm to a radius position of 57 mm. This shows that a recording layer having a very uniform thickness is formed by the vapor deposition method. The broken line in FIG. 4 shows the distribution of the thickness along a radial direction of the recording layer formed by using the spin coater.

DESCRIPTION OF THE PREFERRED EMBODIMENTS

Figure 1:
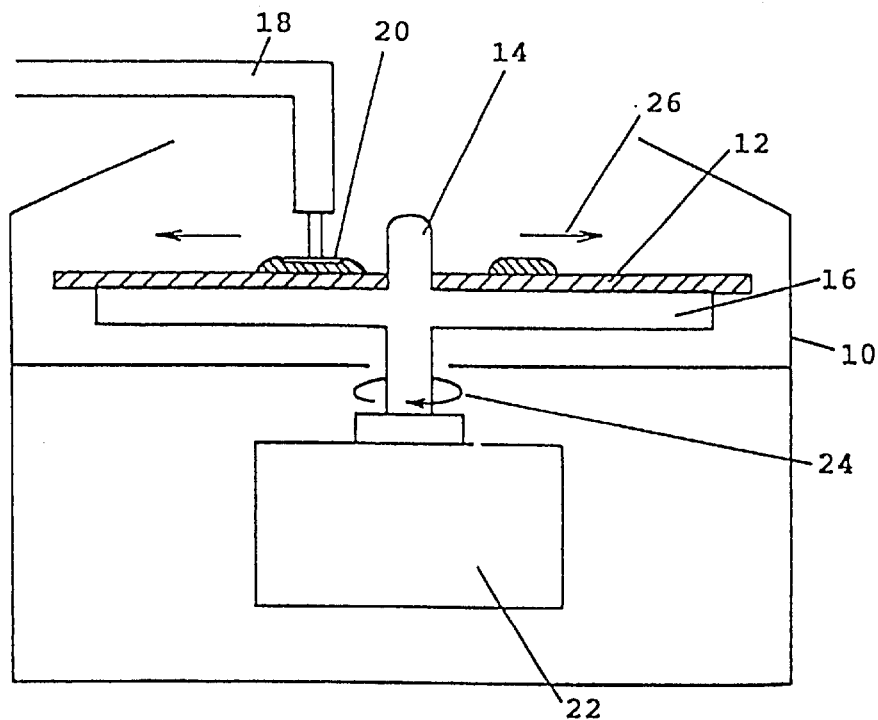
FIG. 1 is a schematic view that shows a spin coater used for conventionally manufacturing an optical recording medium.

In the device of the present invention, the vacuum pre-treatment chamber refers to a chamber into which the substrate for the optical recording medium is loaded prior to the treatment of the substrate, for processing the optical recording medium, under high vacuum (in this sense, also referred to as a "vacuum front chamber").

A substrate is loaded into the vacuum pre-treatment chamber from outside of the device when the pressure of the vacuum pre-treatment chamber is maintained at the same pressure as the outside of the device.

Then, with respect to the pressure, the vacuum pre-treatment chamber is isolated from the outside of the device (or separated therefrom), and the pressure of the vacuum pre-treatment chamber is reduced so as to reach the same pressure as that of the recording layer forming chamber to which the substrate is transported.

When the two chambers come to have the same pressure, the vacuum pre-treatment chamber and the recording layer forming chamber are brought into a connected state with respect to the pressure and the transport of the substrate.

Then, the substrate is transported from the vacuum pre-treatment chamber to the recording layer forming chamber under the same pressure.

Also, in the device of the present invention, the vacuum post-treatment chamber refers to a chamber from which the substrate having a recording layer and a reflective layer formed thereon is removed, after the substrate for the optical recording medium has been processed under the high vacuum (in this sense, also referred to as a "vacuum rear chamber").

In a state where the vacuum post-treatment chamber is isolated (or separated) from the reflective layer forming chamber with respect to the pressure, which reflective layer forming chamber contains the substrate having a reflective layer formed thereon, the vacuum post-treatment chamber is set to reach the same pressure as that of the reflective layer forming chamber.

Then, the reflective layer forming chamber and the vacuum post-treatment chamber are brought into a connected state with respect to the pressure and the transport of the substrate so as to have the same pressure.

Then, the substrate is transported from the reflective layer forming chamber to the vacuum post-treatment chamber.

Then, the vacuum post-treatment chamber is isolated from the reflective layer forming chamber with respect to the pressure.

Then, external air is introduced into the vacuum post-treatment chamber so as to maintain the vacuum post-treatment chamber at the same pressure as that of the outside of the device.

Then, the substrate having the recording layer and the reflective layer is removed from the vacuum post-treatment chamber.

In the present invention, the recording layer forming chamber refers to a chamber in which the recording layer of the optical recording medium is formed by vapor deposition under a pressure of a high vacuum (for example, $10^{-3}$ torr or less). The material for forming the recording layer is a pigment material, in particular, an organic pigment material. Those pigment materials conventionally used for the recording layer of the optical recording medium may be used, or other pigment materials may be used as long as they provide a predetermined optical characteristic. Such a pigment material is heated so as to be melted and evaporated, or directly sublimated in the recording layer forming chamber.

Specific examples of the organic pigment materials for forming the recording layer include: pentamethinecyanine pigments, heptamethinecyanine pigments, squalirium pigments, azo pigments, anthraquinone pigments, indophenol pigments, phthalocyanine pigments, naphthalocyanine pigments, pyrylium pigments, thiopyrylium pigments, azulenium pigments, triphenylmethane pigments, xanthene pigments, indanthrene pigments, indigo pigments, thioindigo pigments, merocyanine pigments, thiazine pigments, acridine pigments, oxazine pigments, and dithiol metal complex pigments. These pigments tend to change their wavelength vs. spectral absorption coefficient characteristics due to a substituent contained therein, and even in the same group of pigments, their light absorption coefficient characteristics change greatly in some cases when their substituent is changed. More preferably, a pigment selected from the group consisting of the phthalocyanine pigments, the naphthalocyanine pigments, the azo pigments and the cyanine pigments, is used for the recording layer, or a mixture of a plurality of the pigments may be used. Alternatively, a known additive agent such as a quenching agent or an UV absorbing agent may be contained in the recording layer on demand. The pigment materials and the required additive agents are selected in accordance with the characteristics of the recording layer to be formed.

Such a pigment material is heated so as to be evaporated (or sublimated) in the recording layer forming chamber, with the result that a pigment material layer is vapor deposited on the substrate or on a recording layer that has been formed on the substrate. The number of the recording layer forming chambers is at least two, and the number may be set greater than this, depending on the number of recording layers required.

At least one recording layer forming unit is placed in each recording layer forming chamber, and the pigment material for forming the recording layer is supplied to this unit, and heated to be evaporated (or sublimated). The pigment material thus evaporated is deposited on the substrate. Therefore, in the device of the present invention, the recording layer forming unit is placed in the recording layer forming chamber, which unit comprises a pigment material supplying mechanism and a pigment material heating (evaporating or sublimating) mechanism. The pigment material supplying mechanism is used for measuring and supplying a predetermined amount of the pigment material to the heating mechanism, and the measuring and supplying processes of the pigment material may be carried out in a continuous manner or in a batch manner. In association with the pigment material supplying mechanism, the heating mechanism carries out a continuous heating process or an intermittent heating process. A heating device included in the heating mechanism is preferably arranged to electrically apply heat, and in a more preferable mode, heating is applied by utilizing electric resistance or electromagnetic induction.

In the present invention, the reflective layer forming chamber refers to a chamber in which a thin film of a material for forming the reflective layer, such as gold, silver or aluminum, is formed on the recording layers that have been already formed, by using a proper method (for example, sputtering, metal vapor deposition, etc.) under a pressure of a high vacuum (for example, at most $10^{-3}$ torr). Therefore, the reflective layer forming chamber comprises at least one reflective layer forming unit, and any known arrangement may be used as the unit as long as it forms a thin film of a reflective layer on the recording layers.

For example, in the case of the formation of the reflective layer using sputtering, the reflective layer forming unit is provided as a sputtering unit which includes a metal material target (sputtering source) for forming a reflective layer, and an ion irradiation device.

In the device of the present invention, each chamber is preferably designed so as to control its pressure independently, and when the substrate (or the substrate holder) is transported from one chamber to another chamber, this design makes it possible to maintain the two chambers at the same pressures while the substrate is being transported from one chamber to the other. This transporting process is carried out virtually in the same manner as the transporting process from the vacuum pretreatment chamber to the recording layer forming chamber or that from the reflective layer forming chamber to the vacuum post-treatment chamber.

In the present invention, the substrate transporting mechanism refers to a mechanism for transporting the substrate from outside of the device to the vacuum pre-treatment chamber, then transporting the substrate from the vacuum pre-treatment chamber to the first recording layer forming chamber, and if necessary, through additional recording layer forming chambers, then transporting the substrate from a last recording layer forming chamber to the reflective layer forming chamber, then transporting the substrate from the reflective layer forming chamber to the vacuum post-treatment chamber, and finally transporting the substrate from the vacuum post-treatment chamber to the outside of the device.

With this substrate transporting mechanism, it is possible to omit the transportation of the substrate from the outside of the device to the vacuum pre-treatment chamber and/or the transportation of the substrate from the reflective layer forming chamber to the vacuum post-treatment chamber.

As long as the above-mentioned functions are available, any appropriate mechanism may be used as the substrate transporting mechanism. More specifically, those mechanisms often used in the field of semiconductor devices for transporting an object from one chamber to another chamber, each having a different pressure, may be used. For example, as will be described later, an embodiment in which the substrate is successively transported between chambers placed adjacent to each other, or an embodiment in which a rotary chamber is placed with respective chambers being arranged on the periphery thereof, may be adopted.

Additionally, since upon transportation of the substrate as described above, there may be a difference in pressure between a chamber holding the substrate and a chamber into which the substrate is to be transported, each chamber is normally provided with a movable wall (partition wall) so as to isolate (or separate) the respective chambers in terms of pressure by closing an opening through which the substrate is passed.

In one preferred embodiment, the optical recording medium manufacturing device of the present invention comprises the vacuum pre-treatment chamber, a plurality of (at least two) the recording layer forming chambers in series for forming the recording layers by vapor deposition, the reflective layer forming chamber, and the vacuum post-treatment chamber, with the recording layer forming chambers being adjacent to each other.

The recording layer forming chamber at one end of the series is adjacent to the vacuum pre-treatment chamber, the recording layer forming chamber at the other end of the series is adjacent to the reflective layer forming chamber, and the reflective layer forming chamber is preferably adjacent to the vacuum post-treatment chamber.

Each of the chambers can maintain a predetermined pressure independently from each other chamber.

The substrate is loaded from the vacuum pre-treatment chamber to the recording layer forming chamber at one end of the series by the substrate transporting mechanism, allowed to enter the reflective layer forming chamber from the recording layer forming chamber at the other end of the series after having passed through the recording layer forming chambers in succession, and thereafter, transported from the reflective layer forming chamber to the vacuum post-treatment chamber.

In the series of the recording layer forming chambers, the recording layers are stacked and formed on the substrate by vapor deposition, and the reflective layer is formed on the stacked recording layers in the reflective layer forming chamber preferably by sputtering.

In a more preferable embodiment, the substrate is loaded into the vacuum pre-treatment chamber from the outside of the device, and finally, taken out of the device from the vacuum post-treatment chamber by virtue of the substrate transporting mechanism.

Figure 5:
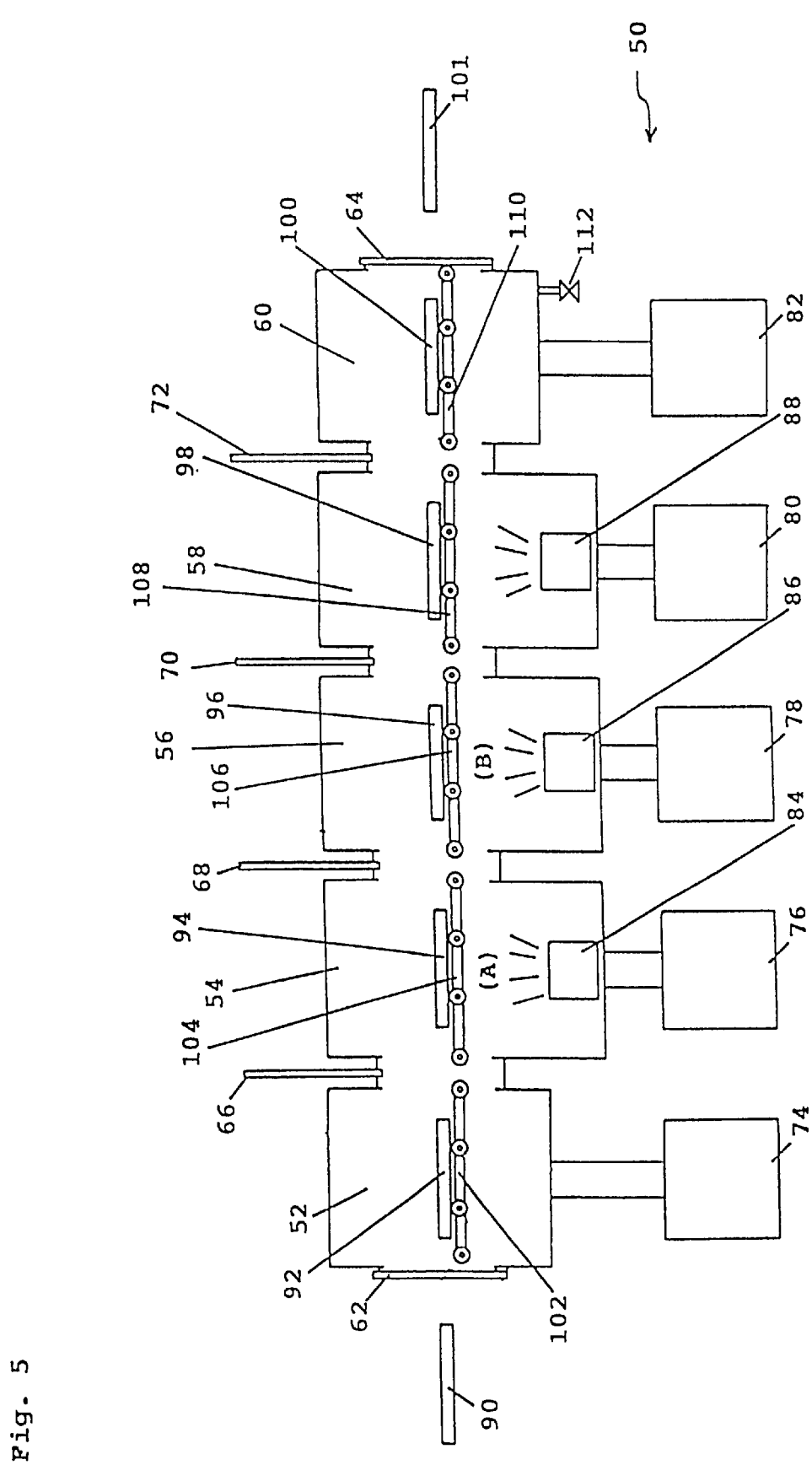
FIG. 5 is a schematic side view that shows one embodiment of the manufacturing device of the optical recording medium of the present invention.

FIG. 5 shows the manufacturing device of the optical recording medium in this preferred embodiment. In FIG. 5, the inside of each chamber is schematically illustrated so as to better understand the construction of the manufacturing device 50 in an embodiment having two recording layer forming chambers. The device 50 comprises the vacuum pre-treatment chamber 52, the recording layer forming chambers 54 and 56, the reflective layer forming chamber 58 and the vacuum post-treatment chamber 60. The vacuum pre-treatment chamber 52 has a substrate inlet 62, and through this inlet the substrate is loaded from the outside of the device into the vacuum pretreatment chamber 52. Moreover, the vacuum post treatment chamber 60 has a substrate outlet 64, and through this outlet the substrate on which the recording layers and the reflective layer have been formed is transported from the vacuum post-treatment chamber 60 to outside the device.

In order to independently control the pressure of each chamber and to allow the substrate to be transported between the adjacent chambers, partition plates 66, 68, 70 and 72, and vacuum evacuation devices 74, 76, 78, 80 and 82 are installed.

In the recording layer forming chambers 54 and 56, recording layer forming units (which are each integrally provided with a recording layer material supplying mechanism and a recording layer material heating mechanism) 84 and 86 are installed. In the reflective layer forming chamber 58, a reflective layer forming unit (for example, a sputtering device) 88 is installed.

The substrates, which are placed on substrate holders 90, 92, 94, 96, 98, 100 and 101, each holding a plurality of the substrates, are transported through the device (a single substrate may of course be transported separately). In order to carry these holders, substrate transporting mechanisms 102, 104, 106, 108 and 110 having transport rollers and belts are installed.

The substrate for the optical recording medium is directly, or in a manner placed on the substrate holder 90, sent to the vacuum pre-treatment chamber 52. Here, the partition plate 66 has closed the inlet to the recording layer forming chamber 54 so that the vacuum pre-treatment chamber 52 is isolated (or separated) from the recording layer forming chamber 54 with respect to pressure. Upon receipt of the substrate holder 90, the vacuum pretreatment chamber 52 is evacuated by the evacuation device 74. When the degree of vacuum of the vacuum pretreatment chamber 52 has reached the level of the vacuum in the recording layer forming chamber 54, which has already reached a predetermined degree of vacuum via the vacuum evacuation device 76, the partition plate 66 is opened so that the vacuum pre-treatment chamber 52 and the recording layer forming chamber 54 are brought into a connected state with respect to pressure and transportation of the substrate. Thus, the substrate holder is transported from the position 92 to the position 94 by the substrate transporting mechanisms 102 and 104. Thereafter, the partition plate 66 is closed.

The recording layer forming unit 84 is placed below the substrate holder 94 in the recording layer forming chamber 54, where a first recording layer material (A) is evaporated and deposited onto the substrate. In this state, the partition plates 66 and 68 are closed.

Upon completion of the treatment in the recording layer forming chamber 54, treatment in the recording layer forming chamber 56 is carried out. At this time, when the recording layer forming chambers 54 and 56 are respectively maintained at different pressures, the pressure of the recording layer forming chamber 54 is adjusted by the evacuation device 76 so as to make it the same as that of the recording layer forming chamber 56, and the partition plate 68 is then opened, so that the substrate holder is moved from the position 94 to the position 96.

When the substrate is to be transported from one chamber to another chamber having a different pressure, the pressure of the chamber currently containing the substrate is controlled to have the same pressure as that of the chamber into which the substrate is to be transported, while both chambers are isolated (or separated) with respect to pressure, and after the same pressure has been achieved, the isolated state of the two chambers is removed so as to transport the substrate.

In the recording layer forming chamber 56, another pigment material (B) is evaporated in the unit 86 in the same manner as with regard to pigment material (A) and unit 84, and is then deposited on the recording layer of the pigment material (A) which has been formed. Thus, a recording layer of the pigment material (B) is also formed.

Thereafter, the substrate holder is transported from the recording layer forming chamber 56 to the reflective layer forming chamber 58; that is, from the state 96 to the state 98. Here, the reflective layer, made of, for example, gold; silver or aluminum, is formed on the recording layer of the pigment material (B) by sputtering, via operation of the reflective layer forming unit 88.

The substrate holder 98 is next transported to the vacuum post-treatment chamber 60 that has been beforehand maintained at the same pressure as the reflective layer forming chamber 58 by the evacuation device 82. The post-treatment chamber 60 is then adjusted to a pressure equal to the outside of the device by a leak valve 112. Thereafter, the outlet opening 64 is opened and the substrate holder 100 is removed from of the device (as in the state indicated by 101).

In another preferred embodiment, the optical recording medium manufacturing device of the present invention comprises the vacuum pre-treatment chamber, a plurality of (at least two) the recording layer forming chambers for forming recording layers by vapor deposition, the reflective layer forming chamber, and the vacuum post-treatment chamber, with the chambers being placed around a rotary chamber having a turn table, preferably at a uniform angular interval from each other.

The chambers and the rotary chamber are allowed to have predetermined pressures independently from each other, and the rotary chamber and the respective chambers are allowed to have a connected state as well as an isolated state (that is, a separated state) relative to each other, with respect to pressure and transportation of the substrate (or the substrate holder).

The substrate is transported from any one of the chambers to another chamber through the rotary chamber by the substrate transporting mechanism, recording layers are stacked and formed on the substrate by vapor deposition in the recording layer forming chambers, and the reflective layer is formed on the stacked recording layers in the reflective layer forming chamber.

Figure 6:
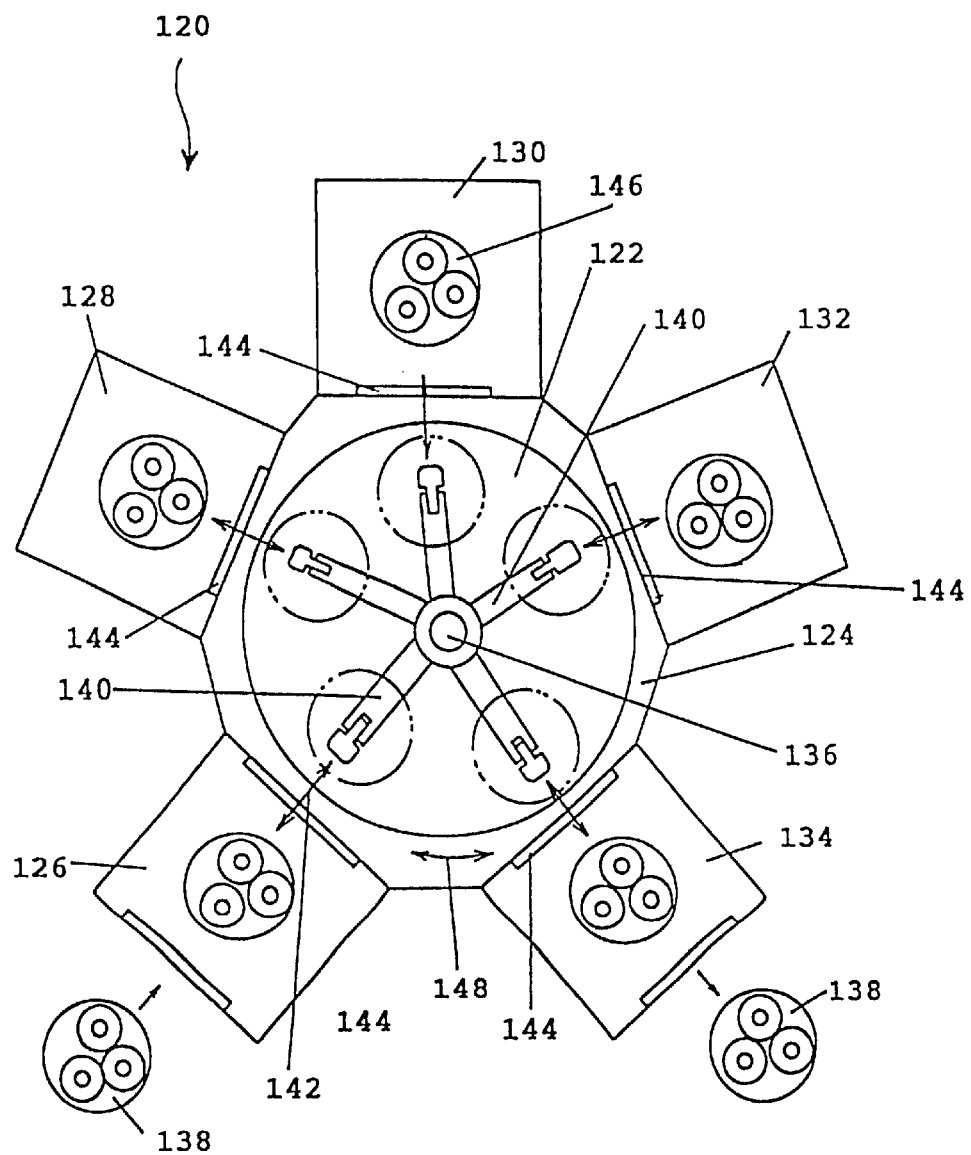
FIG. 6 is a schematic top view that shows another embodiment of the manufacturing device of the optical recording medium of the present invention.

FIG. 6 shows this preferred embodiment. This Figure is a schematic drawing obtained when the manufacturing device for the optical recording medium 120 having two recording layer forming chambers is viewed from the top thereof.

The device 120 has a rotary chamber 124 provided with a turn table 122 in the center thereof. On the periphery of the rotary chamber 124, the vacuum pretreatment chamber 126, the recording layer forming chambers 128 and 130, the reflective layer forming chamber 132 and the vacuum post-treatment chamber 134 are arranged. As illustrated in the Figure, these chambers are spaced relative to one another around a rotary shaft 136 of the turn table at the same angle. The order in which these chambers are placed is not particularly limited; however, it is preferable to arrange them in the order of the processes to be carried out as illustrated in the Figure. The substrate to be treated may be transported between the respective chambers as it is; however, it is preferable to place a plurality of the substrates on the substrate holder 138, which is then to be transported between the chambers as illustrated in the Figure.

With respect to pressure and transport of the substrate holder (or the substrate), the respective chambers are allowed to be in a connected state (in other words, a state in which pressure is transmitted and the substrate holder is transported) with the rotary chamber 124, and an arm 140 allows the substrate holder to be transported in the direction of arrow 142 between the respective chambers and the turn table. A partition plate 144 is placed between each chamber and the rotary chamber so that the connected state of the substrate transportation between the respective chambers and the rotary chamber is provided and removed. In the same manner as in FIG. 5, an evacuation device (not shown) is installed in each chamber (including the rotary chamber) so as to control the respective pressures independently. Here, in the same manner as explained earlier with reference to FIG. 5, the units for forming the recording layers and the reflective layer are placed in the recording layer forming chambers and the reflective layer forming chamber.

The substrate holder 138 is loaded into the vacuum pre-treatment chamber 126, and then transported into the rotary chamber 124 by being chucked by a leading end of the arm 140 that is freely extended along the direction of arrow 142. The substrate holder (indicated by an alternate long and two short dashes line), transported to the rotary chamber 124, is transported to the front of any of the chambers since the turn table 122 is allowed to freely rotate in the direction of arrow 148. With this arrangement, since the substrate for the optical recording medium is transported to any of the chambers, it is possible to form recording layers on the substrate, for example, in any desired order thereof.

Upon completion of the process in one chamber (for example, the recording layer forming chamber 130), the substrate holder 146 is transported onto the turn table 122 from the chamber by the arm 140. Thereafter, the turn table 122 rotates with a predetermined angle (for example, turning to the right) (see arrow 148) such that the substrate holder faces the reflective layer forming chamber 132, and the arm 140 provided in front thereof holds the substrate holder, and then transports the substrate holder into the reflective layer forming chamber 132. Then, the reflective layer is formed on the substrate.

Figure 7:
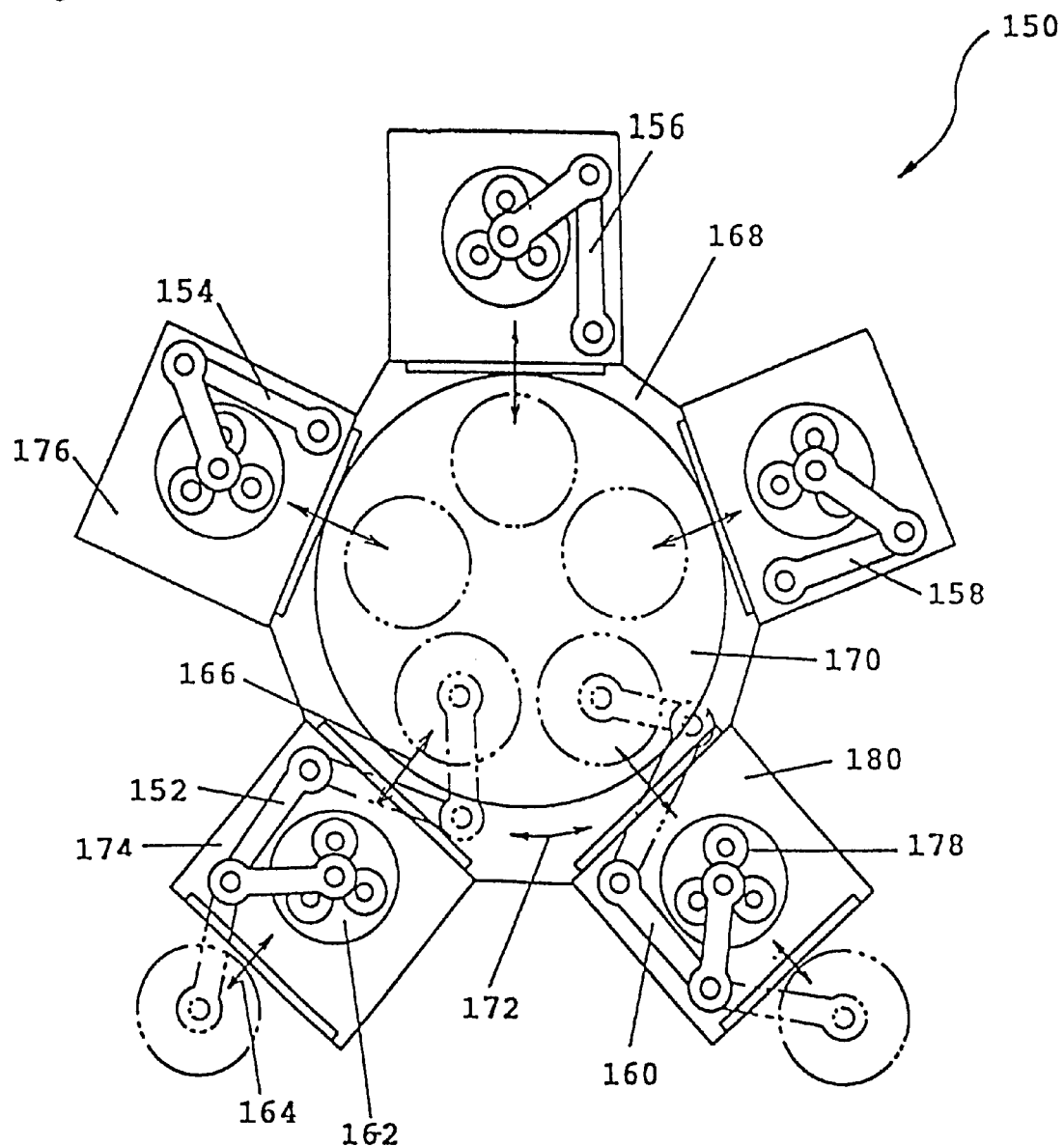
FIG. 7 is a schematic top view that shows a further embodiment of the manufacturing device of the optical recording medium of the present invention.

FIG. 7 shows another preferred embodiment of the optical recording medium manufacturing device of the present invention. In the same manner as in FIG. 6, this Figure schematically shows the device when viewed from the top thereof. The optical recording medium manufacturing device 150 in the embodiment shown in FIG. 7 is different from that shown in FIG. 6 in that single hand robots 152, 154, 156, 158 and 160 are provided for the respective chambers in place of the arms 140 that are freely extended substantially in one-axial direction as shown in FIG. 6.

The substrate holder 162 is taken into the vacuum pre-treatment chamber 174 by the single hand robot 152 that is freely movable in states indicated by arrow 164 and has a chucking function at its one end. This single hand robot, which is used in a manufacturing process for semiconductor elements, in a clean room, is highly free from dust generation.

The single hand robot 152 is further shifted to a state indicated by arrow 166 so that the substrate holder 162 is transported onto a turn table 170 inside a rotary chamber 168. Thereafter, the turn table 170 is rotated clockwise in the direction of arrow 172 so that the substrate holder is allowed to face the recording layer forming chamber 176, and then taken into this chamber 176 by the robot arm 154 associated with this chamber so as to be subjected to the next process. Lastly, the holder 178, which has been transported through the respective chambers in succession, is taken out of the vacuum post-treatment chamber 180 by the single hand robot 160.

In the device shown in FIG. 7, since the single hand robot which is highly free from dust generation is adopted, it is possible to produce the optical recording medium with a very low error rate, and also to provide production that is less susceptible to dust generation even in the case of a continuous production for a long time.

As explained earlier, in the recording layer forming chambers of the device of the present invention, the recording layer is formed by vapor depositing a material forming the recording layer. Therefore, the pigment material supplying mechanism and the pigment material heating mechanism are installed in the recording layer forming chamber.

Figure 8:
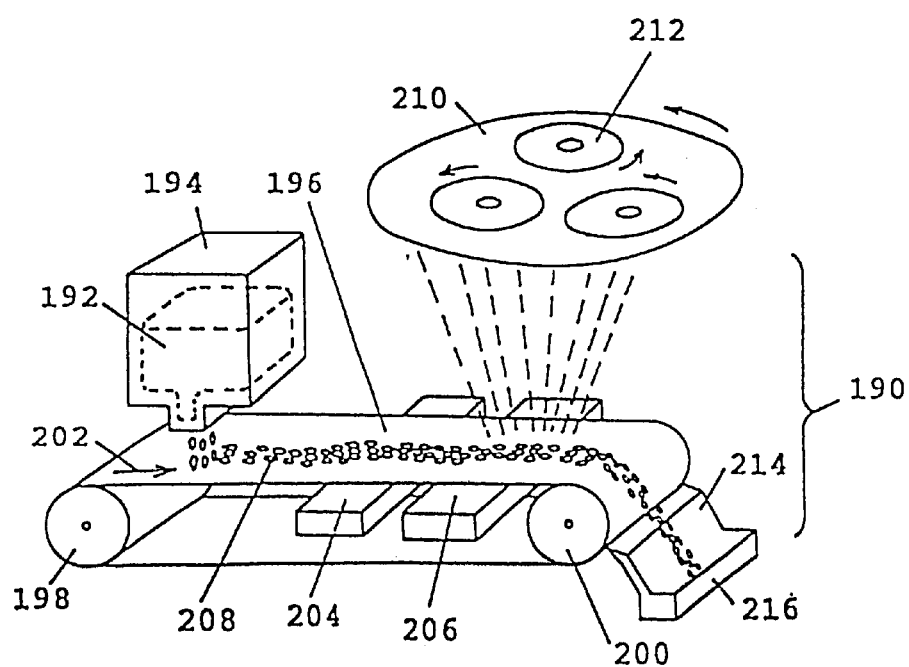
FIG. 8 is a perspective view that shows a mechanism for heating a pigment material while continuously supplying the pigment material, used in the device of the present invention.

FIG. 8 is a schematic perspective view that shows one preferred embodiment of a recording layer forming unit 190, comprising the pigment material supplying mechanism and the pigment material heating mechanism, that is applicable to the optical recording medium manufacturing device of the present invention.

A pigment material 192 is discharged from a reservoir (for example, a hopper) 194, which stores the pigment material 192, onto a pigment material conveyor belt 196 at a predetermined amount per unit time. This conveyor belt 196 is driven by rollers 198 and 200 so that the material is transported in the direction of arrow 202 at a predetermined speed. Below the belt 196, a pigment material preheating heater 204 and a pigment material heating and evaporating heater 206 are installed so as to heat and evaporate the pigment material 208 on the belt. The pigment, thus evaporated, is deposited on a substrate 212 held on a substrate holder 210 located over the recording layer forming unit 190. Here, the recording layer forming unit 190 is provided with a mechanism 214 for scraping the remaining pigment material which has not been evaporated (for example, a scraper), and a dust receiver 216 for receiving the scraped pigment is installed on the downstream side of the scraper 214.

In the recording layer forming unit as shown in FIG. 8, the pigment material is continuously supplied; however, in another embodiment of the present invention, the pigment material is supplied in a batch manner.

Figure 9:
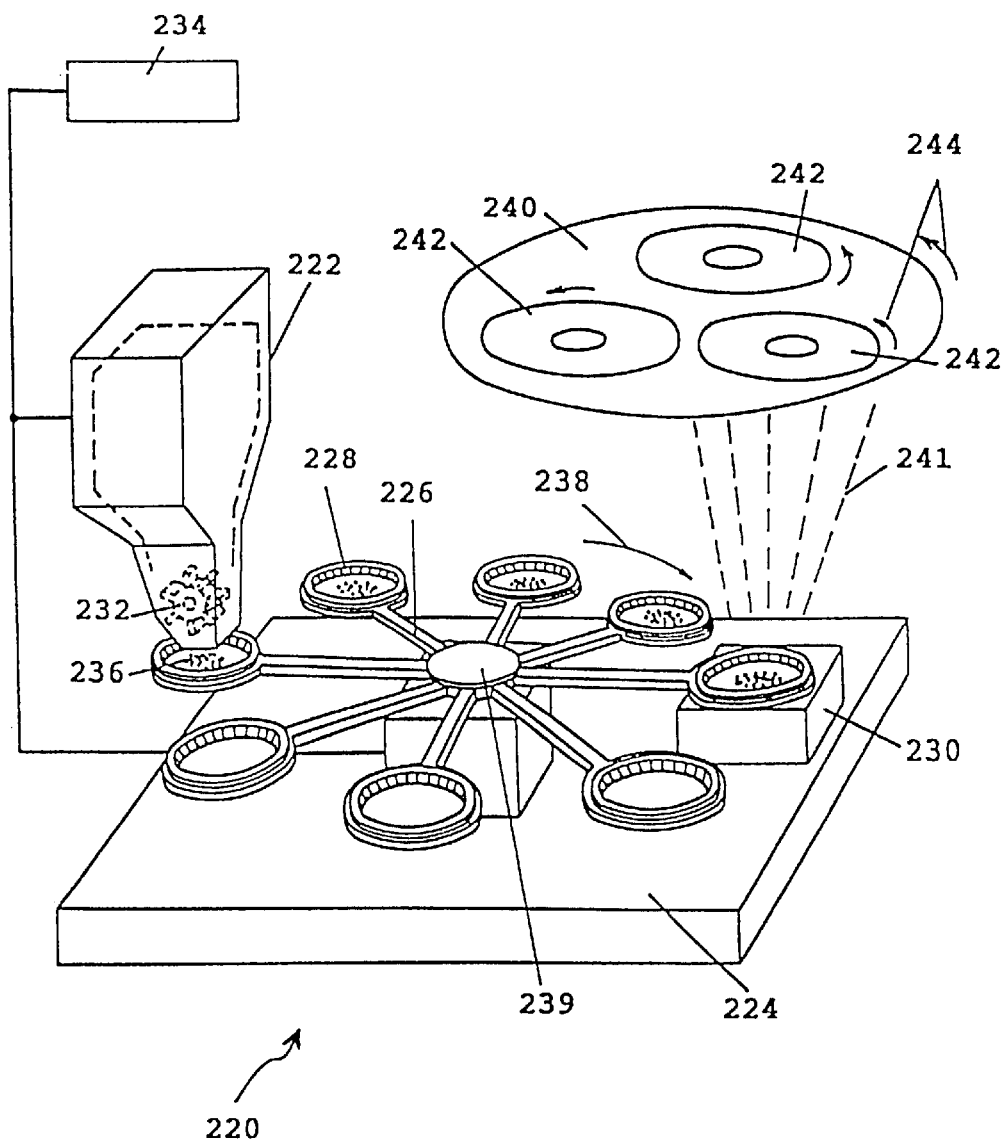
FIG. 9 is a perspective view that shows one embodiment of the mechanism for heating the pigment material while intermittently supplying the pigment material, used in the device of the present invention.

FIG. 9 is a schematic perspective view that shows a recording layer forming unit 220 in another preferred embodiment that comprises the pigment material supplying mechanism and the pigment material heating mechanism.

This recording layer forming unit 220 comprises a pigment material intermittent supplying mechanism 222 and a pigment material heating mechanism (for example, a pigment material evaporation source) 224. The pigment material heating mechanism 224 includes rotary arms 226 for transporting the pigment material, measuring cups 228 and a heating device 230. The number of the measuring cups 228 and the rotary arms 226 is not intended to be limited by the number shown in the Figure, is normally set to not less than two, and is preferably 4 to 10, specifically 8. The pigment material intermittent supplying mechanism 222 is allowed to supply a predetermined amount of the pigment material 236 to the measuring cup 228 by using a gear (or an impeller) 232 capable of dosing a predetermined amount of the material stored inside supplying mechanism 222, and a controlling circuit 234 for controlling the rotation of the gear 232.

The pigment material may specifically be provided as an organic pigment material, and the pigment material that has been supplied onto the measuring cup 228 is further sent onto the heating device 230 by the rotation of the rotary arm 226 through a predetermined angle in the direction of the arrow 238 around the center 239 that is made in response to an instruction from the control circuit 234. The pigment material 228, thus sent, is heated by the heating device 230 and evaporated in a manner as indicated by a broken line 241 so as to be deposited on the substrate 242 on a substrate holder 240 located above the unit. With respect to the heating device 230, an electric resistance heating mode is adopted, and an induction heating system may also be adopted.

The optical recording medium substrate 242, placed on the substrate holder 240, is preferably rotated and revolved in the direction of arrows 244 by using a mechanism that will be described later.

Figure 10:
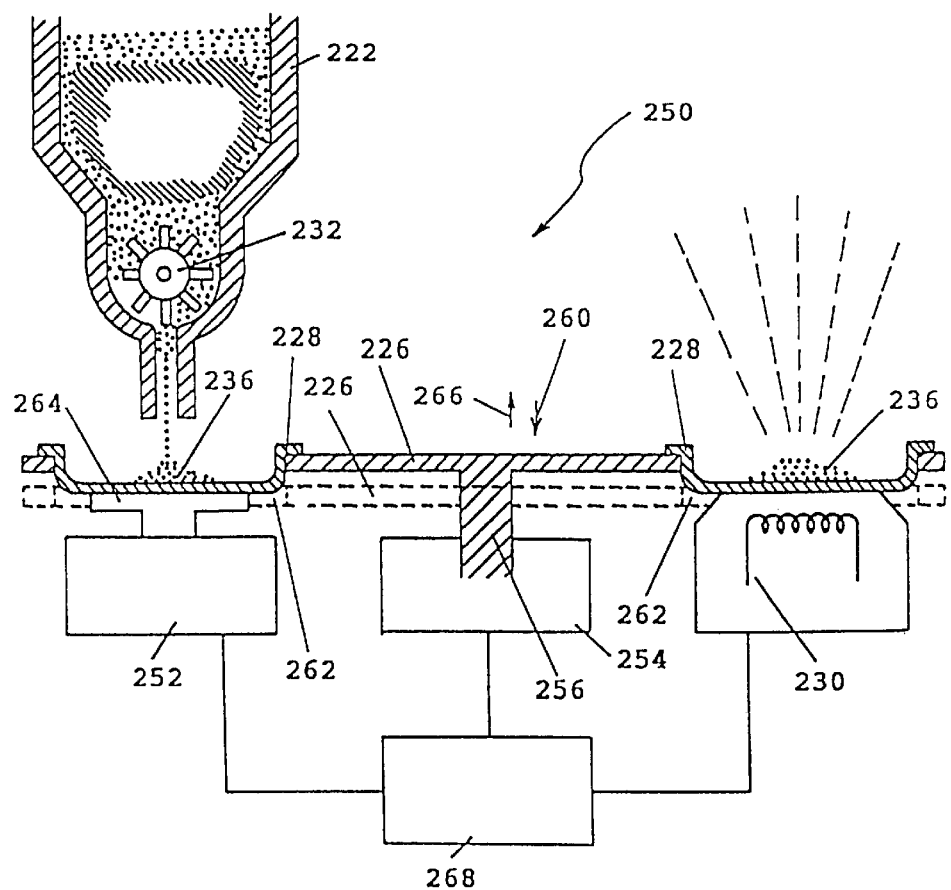
FIG. 10 is a perspective view that shows another embodiment of the mechanism for heating the pigment material while intermittently supplying the pigment material, used in the device of the present invention.

FIG. 10 shows a schematic side view of a recording layer forming unit 250 in a further embodiment. In this embodiment, in order to weigh an amount of supply of the pigment material with an improved accuracy by using the pigment material intermittent supplying device, the weight of the pigment material supplied onto the measuring cup 228 is measured by a weighing device 252. The rotary arm 226 is rotated by a rotary arm driving unit 254.

The pigment material 236 is supplied onto the measuring cup 228 from the intermittent supplying device 222 by the material measuring gear 232, and at this time, the rotary shaft 256 of the rotary arm 226 is shifted downward as indicated by arrow 260 (indicated by a broken line). A hole 262 for supporting the edge of the measuring cup 228 is formed in the end of the rotary arm 226, and since the measuring cup is supported by the peripheral portion of the hole, the bottom of the measuring cup 228 is supported by a receiving tray 264 of the weighing device 252 so that it is separated from the rotary arm 226 independently. Thus, the bottom of the measuring cup 228 is supported by the receiving tray 264 of the weighing device in an independent manner, thereby allowing the weight of the pigment material supplied onto the measuring cup to be determined.

The weighing process is carried out by using a principle of an electronic balance, and the tare weight of the measuring cup 228 has been deducted prior to the measurement so that only the weight of the vacuum treatment material 236 is measured. Upon completion of the predetermined measurement, the material weighing gear 232 stops supplying the material. Thereafter, the rotary shaft 254 is shifted in the direction of arrow 266, and the measuring cup 228 is again held, and the rotary arm 226 is then rotated in the horizontal plane so that the respective cups are shifted to the next positions. The pigment material 236 that has already been weighed and located on the measuring cup 228 is heated by the heater 230 so that the pigment material is evaporated.

Upon completion of the evaporation of the material, the empty measuring cup 228 is sent below the pigment material intermittent supplying device 222, and the measurement of the pigment material is again started. In FIG. 10, only two measuring cups are shown; however, in a practical case, not less than two measuring cups may be used, and successively shifted. Such measuring and heating processes of the pigment material are controlled by a control unit 268. In the case when the pigment material is supplied intermittently in this manner, only the pigment material required for the formation of the recording layer can be weighed and supplied; therefore, it is possible to reduce losses of the pigment material as compared with the case in which the supplying process is performed continuously.

Figure 11:
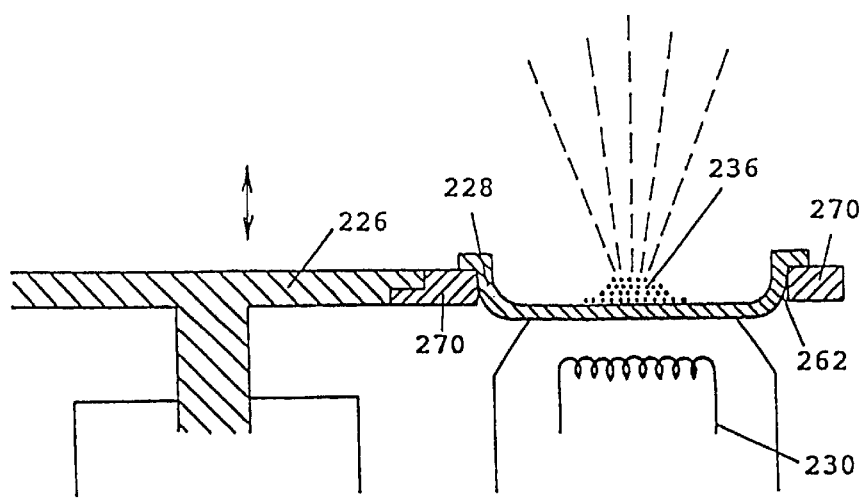
FIG. 11 is a perspective view that shows a further embodiment of the mechanism for heating the pigment material while intermittently supplying the pigment material, used in the device of the present invention.

FIG. 11 shows a preferred embodiment of the pigment material intermittent supplying device. In this embodiment, the portion at the end of the rotary arm 226 shown in FIG. 9 or FIG. 10, which portion supports the measuring cup 228, that is, a measuring cup receiving section 270 is made of a heat insulation material (for example, ceramics, such as Machinable Ceramics (made by Mitsui Kozan Material K.K.)). For this reason, since heat applied by the heating device 230 is not allowed to escape toward the rotary arm 226, the pigment material 236 on the measuring cup 228 can be heated in a stable manner.

Figure 12:
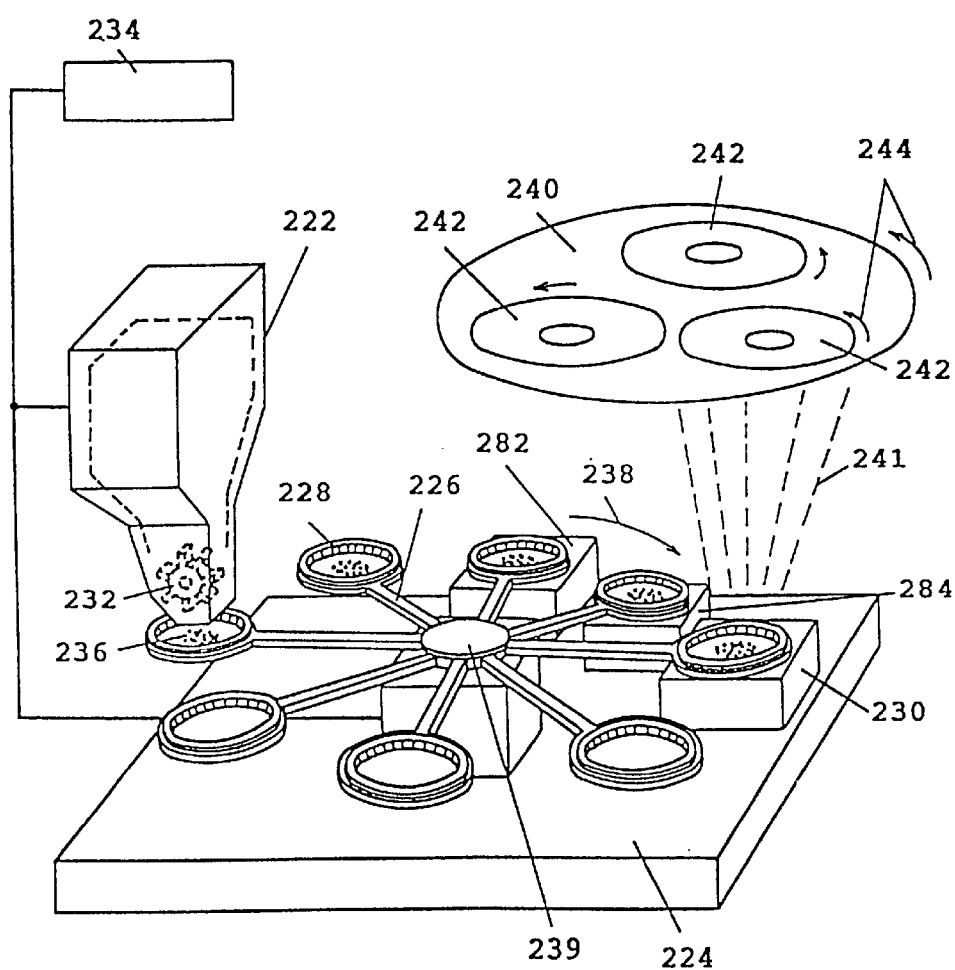
FIG. 12 is a perspective view that shows one embodiment of a heating device of the mechanism for heating the pigment material while intermittently supplying the pigment material, used in the device of the present invention, with the heating device including a pre-heating device.

FIG. 12 shows a more preferable embodiment of the pigment material heating mechanism shown in FIG. 9. In this embodiment, in addition to the heating device 230, a plurality of pre-heating devices 282 and 284 that are heated independently are installed. When the pigment material heating mechanism is arranged in this manner, the pigment material 236 is first allowed to contact the first pre-heating device 282 so as to be pre-heated to a predetermined temperature, and further allowed to contact the second pre-heating device 284 so as to be heated to a predetermined higher temperature. Finally, the pigment material 236 is heated by the heating device 230 to a predetermined high temperature and evaporated. In this manner, in the pigment material heating mechanism provided with a plurality of independent heating devices, the pigment material 236 is heated not abruptly, but gradually and moderately; therefore, evaporation is carried out very efficiently in a stable manner, whereby it is possible to avoid the problem of splashing of the pigment material to a maximum degree, and consequently to provide an optical recording medium having stable performance.

Figure 13:
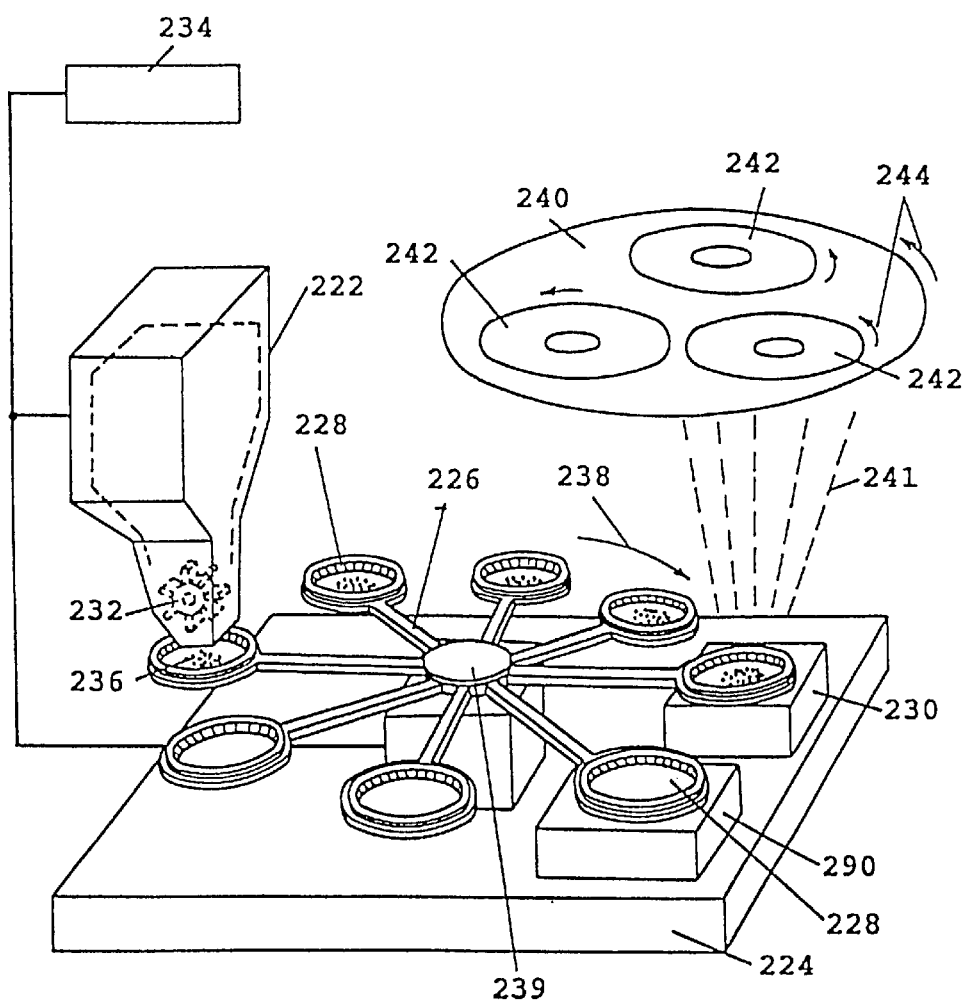
FIG. 13 is a perspective view that shows another embodiment of a heating device of the mechanism for heating the pigment material while intermittently supplying the pigment material, used in the device of the present invention, with the heating device including a cooling device.

FIG. 13 shows another preferable embodiment of the pigment material heating mechanism of FIG. 9. In this embodiment, a cooling device 290 is further installed in the embodiment shown in FIG. 9. With respect to the cooling device 290, any applicable device may be used, and for example, those devices utilizing the Peltier effect may be adopted.

In a case where the temperature of the measuring cup 228 is not allowed to drop considerably after the measuring cup 228 has been heated by the heating device 230 and the pigment material 236 has been evaporated, when the next series of processes including the measuring, heating and evaporating processes are carried out, the resulting process tact (or takt) is raised. In other words, the processing time required is shortened, and the measuring cup is brought into a state where it is difficult to cool it sufficiently, thereby causing a difficulty in carrying out a stable evaporation of the pigment material. In such a case, the presence of the cooling device 290 makes it possible to reduce the temperature of the measuring cup 228 to a proper temperature, thereby making it possible to provide a high-speed recording layer forming process and also to ensure stable product performance. The cooling device 290 may be provided as a single device, or as a plurality of devices, and in the latter case more efficient temperature control is obtained.

Figure 14:
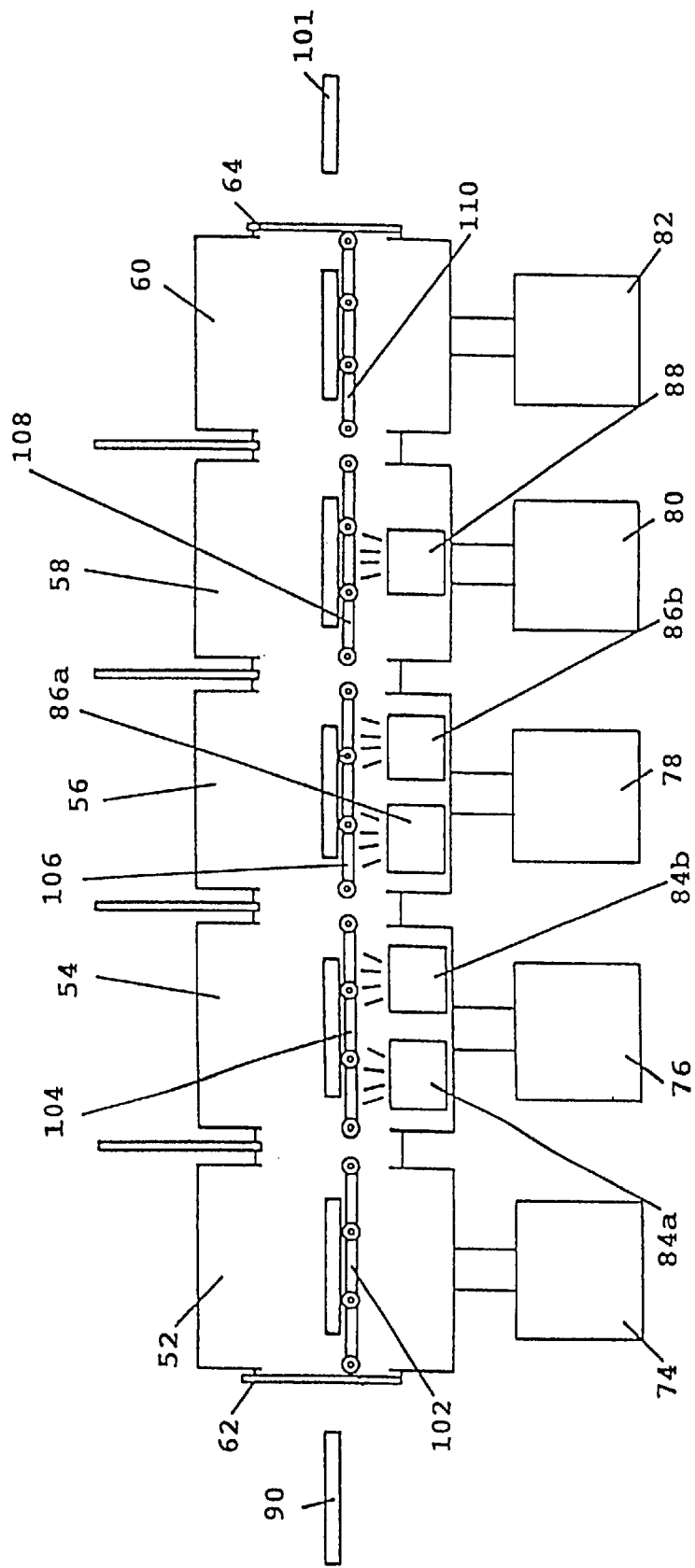
FIG. 14 is a schematic side view that shows one embodiment of the manufacturing device of the optical recording medium of the present invention in which a plurality of recording layer forming units are placed in a recording layer forming chamber.

FIG. 14 shows a further embodiment of the manufacturing device of the optical recording medium of the present invention. This embodiment is substantially the same as that shown in FIG. 5 except that a plurality of the recording layer forming units (where the recording layer pigment material supplying mechanism and the heating mechanism are mounted together) are installed. For example, as shown in the Figure, recording layer forming units 84a and 84b are placed in the recording layer forming chamber 54, and recording layer forming units 86a and 86b are placed in the recording layer forming chamber 56. It is of course not necessary to install a plurality of recording layer forming units in all the recording layer forming chambers. These recording layer forming units may evaporate the same pigment material or may be arranged optionally to evaporate different pigment materials.

When the same pigment material is evaporated, since the evaporated pigment material is distributed within the recording layer forming chamber more uniformly, it is possible to form a more uniform recording layer. Moreover, when different pigment materials are evaporated, a recording layer is formed by using a mixture consisting of these different pigment materials. Furthermore, even in the case where different pigment materials are evaporated, when one specific pigment material is heated and evaporated while the rest of the pigment materials are not heated or evaporated, or the rest of the pigment materials are otherwise prevented from reaching the substrate by providing a shielding device (for example, a shutter mechanism as will be described later) when they are heated and evaporated, it is possible to form a plurality of recording layers on the substrate by using a single recording layer forming chamber.

Figure 15:
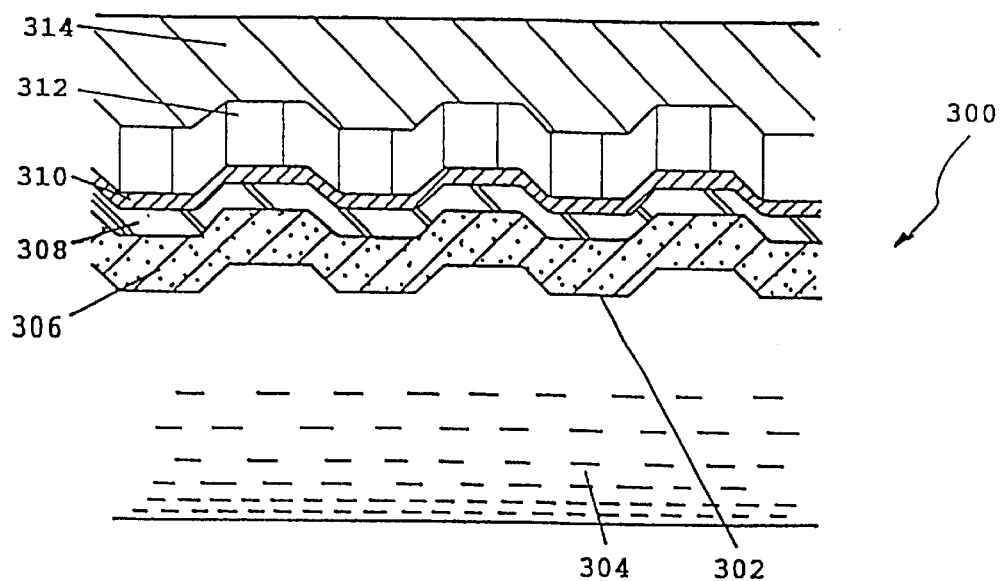
FIG. 15 is a schematic cross-sectional view that shows a portion of another optical recording medium manufactured by the present invention.

FIG. 15 schematically shows a cross-sectional view of a portion of a final product of an optical recording medium 300 produced by such a device. In this optical recording medium, on a substrate 304 having a groove 302, made of polycarbonate, are formed a recording layer 306 formed by a mixture of different organic pigment materials evaporated by a plurality of the recording layer forming units (for example, 84a and 84b), recording layers 308 and 310 formed by different pigment materials (in which the layer 308 was formed first and the layer 310 was then formed in a single recording layer forming chamber having the shutter mechanism as described above), a reflective layer 312, and a protective layer 314. Except for the protective layer 314, the layers are formed by the manufacturing device of the present invention.

The recording layer 306, which was formed by the mixture of different organic pigment materials that had been evaporated (or sublimated) by a plurality of (for example, two) the recording layer forming units, may have optical characteristics (light absorption, transmission coefficient, refractive index, extinction coefficient, etc.), in particular a spectral reflection coefficient and a spectral absorption coefficient, which result in, because of at least a qualitative manner of each of the pigment materials, or because of the synergistic effect of these pigment materials, a new optical characteristic. Therefore, a recording layer having a desired optical characteristic can be formed by using a trial and error method for measuring optical characteristics by examining various combinations of the organic pigment materials.

The creation of such a new optical characteristic takes place, not only in the case of formation of the recording layer by using the mixture of the pigment materials as described above, but also in the case when a plurality of the recording layers of different pigment materials are laminated. For example, when one or more of the recording layers show optical filter functions, it becomes possible to change the wavelength-spectrum characteristic curve in its shape of the recording layer as a whole (for example, to change a peak shape, or to shift a peak position). With respect to the combination of the pigment materials constituting the stacked recording layers, stacked recording layers having desired optical characteristics can be selected by using a trial and error method in which a desired combination is selected after examining various combinations in the same manner as described above.

Moreover, the creation of such new or different optical characteristics is sometimes obtained by changing the thermal decomposition (or modification) characteristic of the recording layer through changing the kind of metal that is to be used for the reflective layer.

Figure 16:
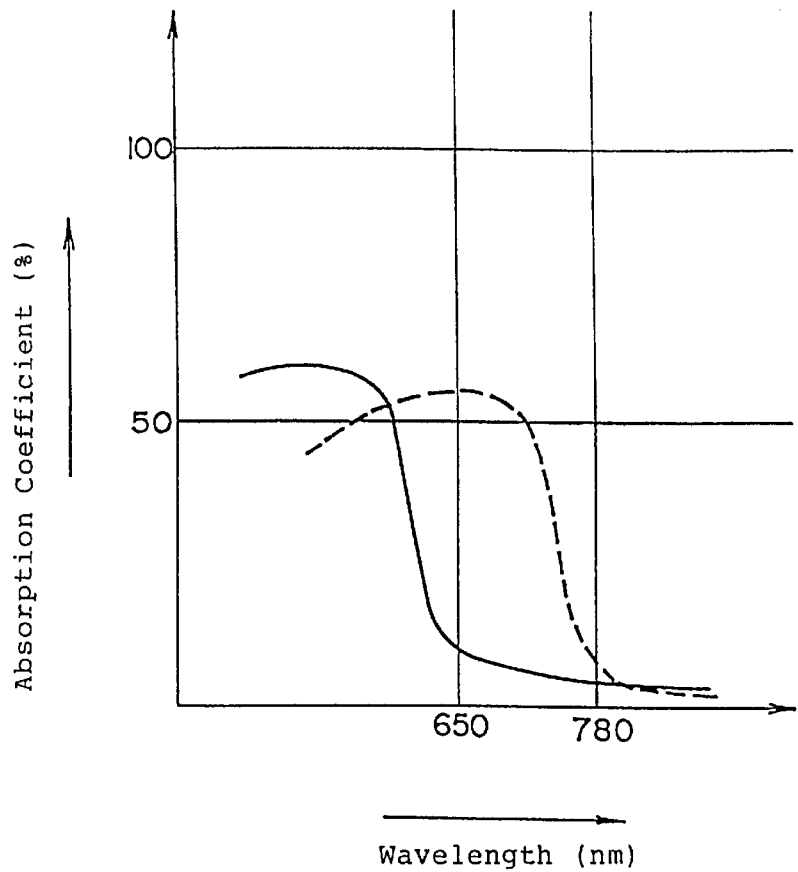
FIG. 16 shows the optical absorption coefficient vs. light wavelength curve of an optical recording medium manufactured by the present invention.

FIG. 16 shows the results of measurements (indicated by a solid line) of the light absorption coefficient of the optical recording medium (CD-R, shown in FIG. 15) obtained by forming the following three different recording layers on a substrate. In the graph of the Figure, the axis of ordinate represents the absorption coefficient characteristic of the recording layer and the axis of abscissa represents the light wavelength.

Recording layer 306: phthalocyanine compound (FOM-250509 made by Wako Pure Chemical Industries, Ltd.), 30 nm in thickness.

Recording layer 308: merocyanine compound (NK2097 made by Nippon Kanko Shikiso Laboratory), 50 nm in thickness.

Recording layer 310: merocyanine compound (NK2045 made by Nippon Kanko Shikiso Laboratory), 40 nm in thickness.

Reflective layer 312: gold (by sputtering), 70 nm in thickness.

Here, for comparative purposes, the spectro-absorption coefficient characteristic of a write-once type optical recording medium having a recording layer made of cyanine that is used in a conventional single wavelength (normally of 780 nm) applicable CD is indicated by a broken line.

As clearly shown by the graph, the optical recording medium having a plurality of recording layers manufactured by the method of the present invention has a comparatively small spectral absorption coefficient even at a newly proposed shorter wavelength for a higher density, for example, 650 nm (therefore, being usable as DVD-Rs). As a result, it is confirmed that the optical recording medium is capable of recording and/or reproducing by the use of not only a longer wavelength such as used in CDs, but also a shorter wavelength (that is, a spectrum characteristic for a write-once type optical disk applicable to a plurality of wavelengths). The write-once type optical recording medium, thus constructed, is capable of recording and/or reproducing while using a plurality of laser wavelengths, and this basic construction can be well applied even if the applied beam wavelength is further shortened because of the further development of laser technology.

In a preferable embodiment of the present device, a shutter mechanism for allowing and preventing the vapor deposition is installed in at least one of the recording layer forming chambers so that the thickness of the recording layers to be formed on the substrate is controlled. Moreover, the shutter mechanism may be provided in the reflective layer forming chamber so that, for example, the deposition of the metal to be sputtered onto the recording layers can be allowed and prevented.

Figure 2:
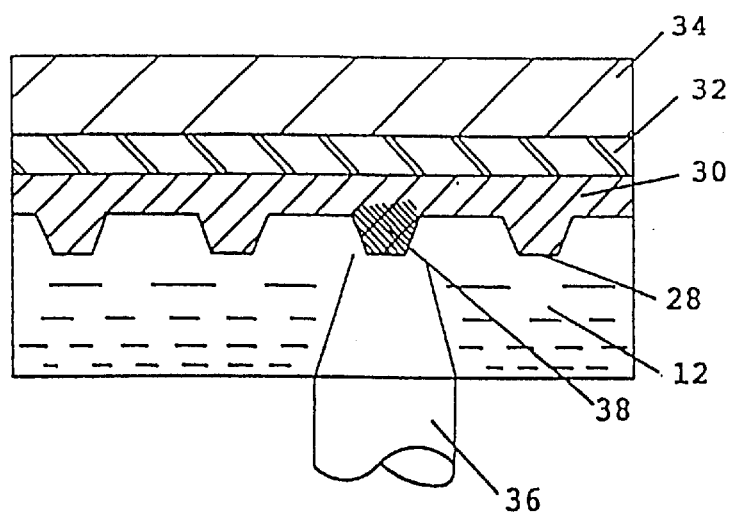
FIG. 2 is a schematic cross-sectional view that shows a portion of the conventional optical recording medium.
Figure 3:
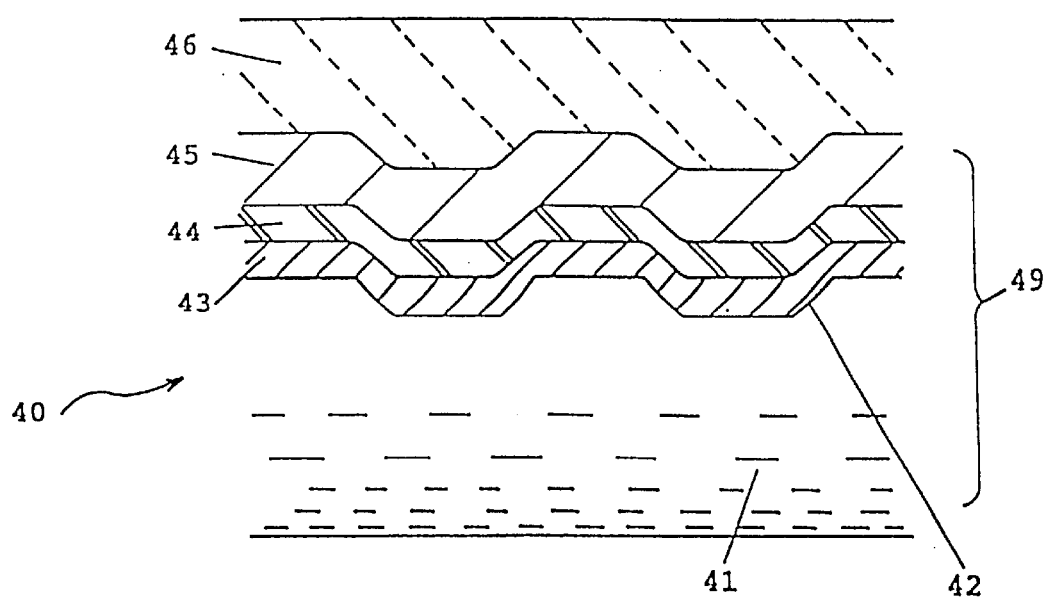
FIG. 3 is a schematic cross-sectional view that shows a portion of an optical recording medium manufactured by the present invention.
Figure 4:
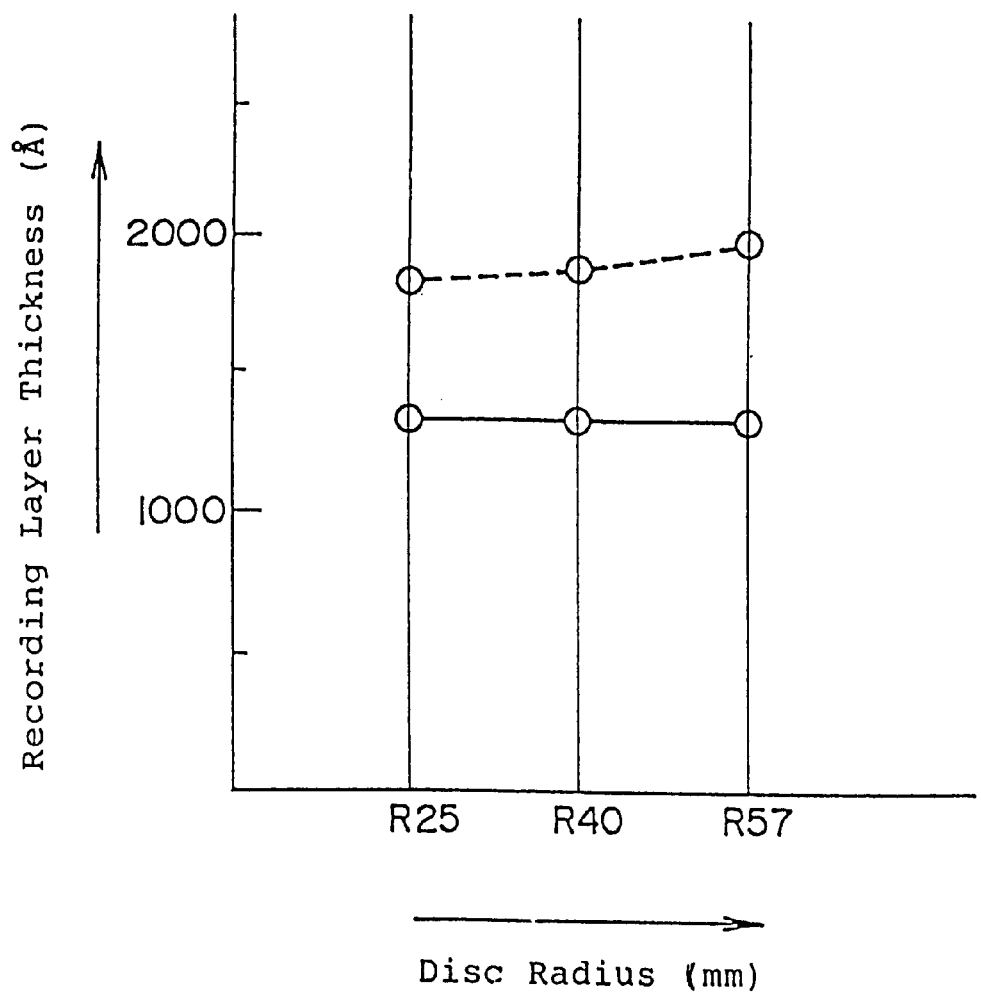
FIG. 4 is a graph that shows variations in the thickness of the recording layer along a disk radial direction of the optical recording medium manufactured by the present invention.
Figure 17:
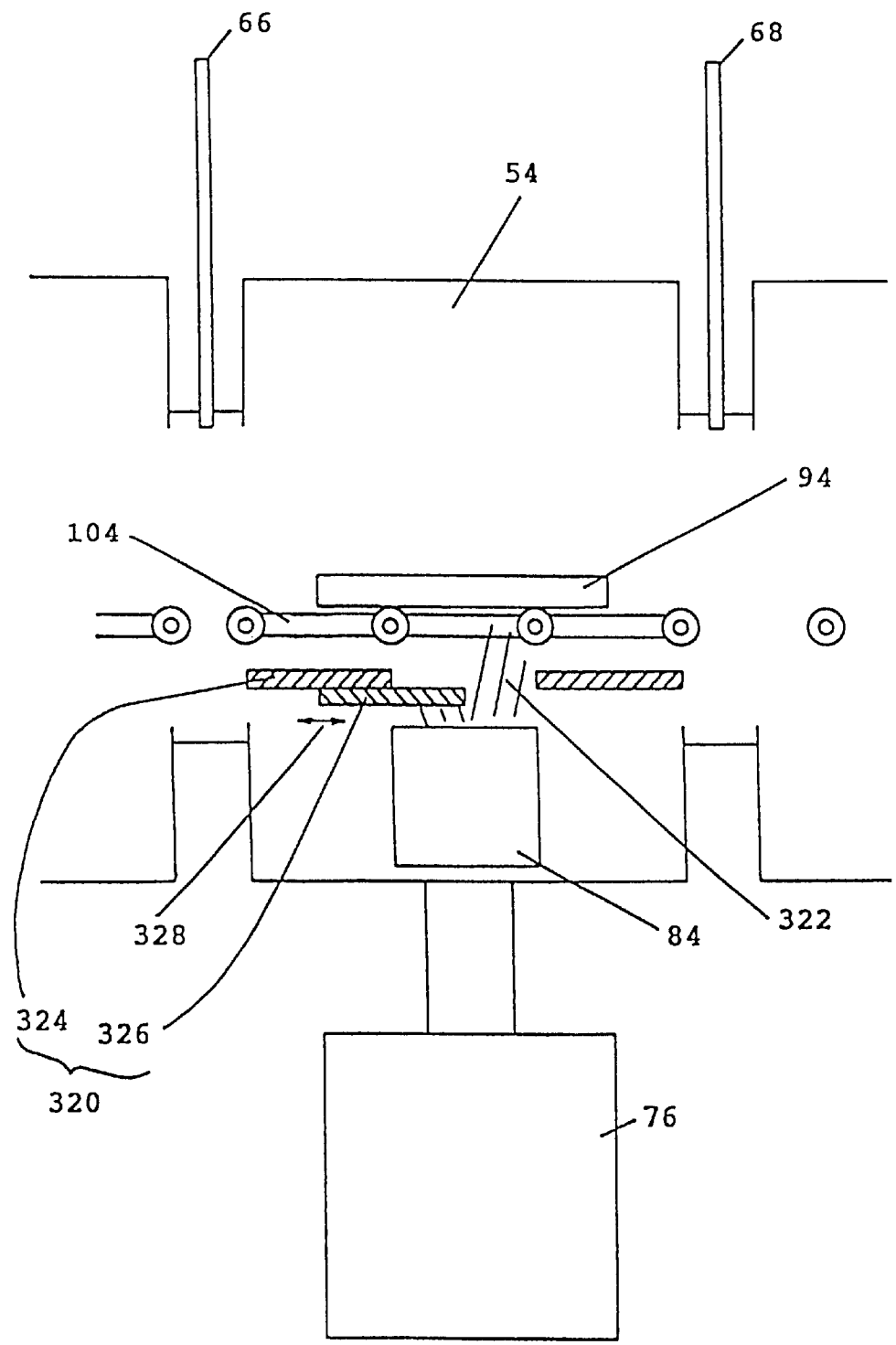
FIG. 17 is a schematic side view that schematically shows a shutter mechanism placed in a recording film forming chamber of the device of the present invention.

FIG. 17 schematically shows a cross-sectional view of the recording layer forming chamber 54 of FIG. 2 in which such a shutter mechanism is installed. A film-thickness controlling shutter mechanism 320 is installed between the optical recording medium substrate holder 94 and the recording layer forming unit 84. This shutter mechanism 320 comprises a static section 324 for defining an opening 322 through which evaporated pigment material passes, and a sliding plate 326 that opens and closes the opening. When the sliding plate 326 is allowed to slide in the direction of arrow 328 and the opening 322 is closed, the evaporated pigment is not allowed to reach the substrate (OFF state). In contrast, when the opening 322 is opened, the evaporated pigment is allowed to reach the substrate (ON state). Thus, such opening and closing operations of the sliding plate 326 make it possible to adjust the thickness of the recording layers. The evaporation rate of the organic pigment material from the recording layer forming unit 84 is controlled by the degree of the application of heat by the heating device (for example, 204 and 206 in FIG. 8), and by installing the shutter mechanism it is possible to provide control with higher accuracy. In particular, in the case of formation of the recording layers at high speeds, it is possible to provide control with higher accuracy by opening and closing the sliding plate 326. Moreover, a film-thickness measuring device may be installed in the recording layer forming chamber so that the thickness of the recording layers formed on the substrate is measured in an on-line manner or in an intermittent manner, and based on the results of the measurements, the shutter mechanism can be feedback controlled.

Figure 18:
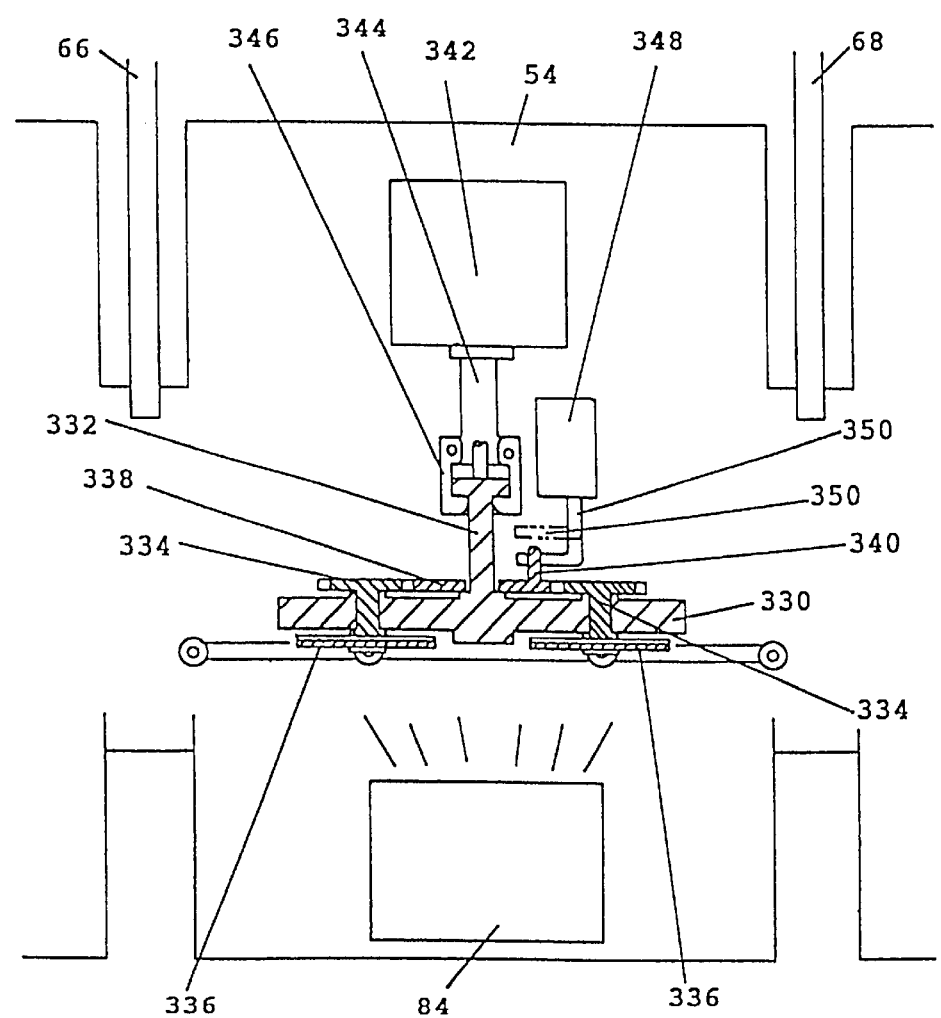
FIG. 18 is a schematic side view that shows a rotation/revolution mechanism for the substrate, which mechanism is placed in the recording film forming chamber of the device of the present invention.

In a preferred embodiment of the device of the present invention, a mechanism for rotating the substrate as well as for revolving it upon formation of the recording layers, that is, a rotating and revolving mechanism, is installed in the recording layer forming chamber. FIG. 18 schematically shows the cross-sectional view of the recording layer forming chamber 54 of FIG. 2 having this mechanism.

In the Figure, reference numeral 330 is a substrate holder, 332 is a holder shaft, 334 is a rotary gear to which the substrate 336 is attached, 338 is a gear within which the rotary gear 334 is engaged, 340 is a rotation stopping member attached to the gear 338, 342 is a holder rotation motor, 344 is a rotary shaft, 346 is a hook, 348 is a plunger, and 350 is a lever.

This rotation/revolution mechanism may be attached to at least one of the recording layer forming chambers and the reflective layer forming chamber, and a plurality of the optical recording medium substrates 336 may be attached to the substrate holder 330. When the substrate holder 330 is sent into the recording layer forming chamber 54, the holder shaft 332 is chucked by the hook 346 so that the substrate holder is rotated by the rotation motor 342 through the rotary shaft 344. Therefore, the substrate 336 held by the substrate holder 330 is rotated around holder shaft 332; that is, the substrate 336 is revolved. The gear 338 is designed so as to rotate around the rotary shaft 334, and when the lever 350 is lowered by the function of the plunger 348 and engaged with the rotation stopping member 340 (shifted from a state indicated by an alternate long and two short dashes line to a state indicated by a solid line), the rotation of the gear 338 is stopped, with the result that the rotary gear 334 which is engaged with the gear 338, is allowed to rotate by the rotation of the holder shaft 332 so that the substrate 336 attached thereto is rotated. Consequently, as a whole, the optical recording medium substrate 336 is allowed to rotate and revolve over the recording layer forming unit 84.

When the lever 350 is at a position indicated by the alternate long and two short dashes line, the gear 338 is allowed to rotate together with the holder shaft 332, with the result that the rotary gear 334 is not rotated. In this case, the optical recording medium substrate 336 only revolves around the holder shaft 332. In contrast, it is possible that only the substrate is allowed to rotate. As compared with the mode in which the substrate is stopped, since the pigment material is vapor deposited while the optical disk substrate is being rotated (revolved and/or rotated about itself), it is possible to form a more uniform recording layer on the substrate. These rotation/revolution mechanisms can also be constructed from a chain mechanism or a mechanism having an epicyclic gear.

Figure 19:
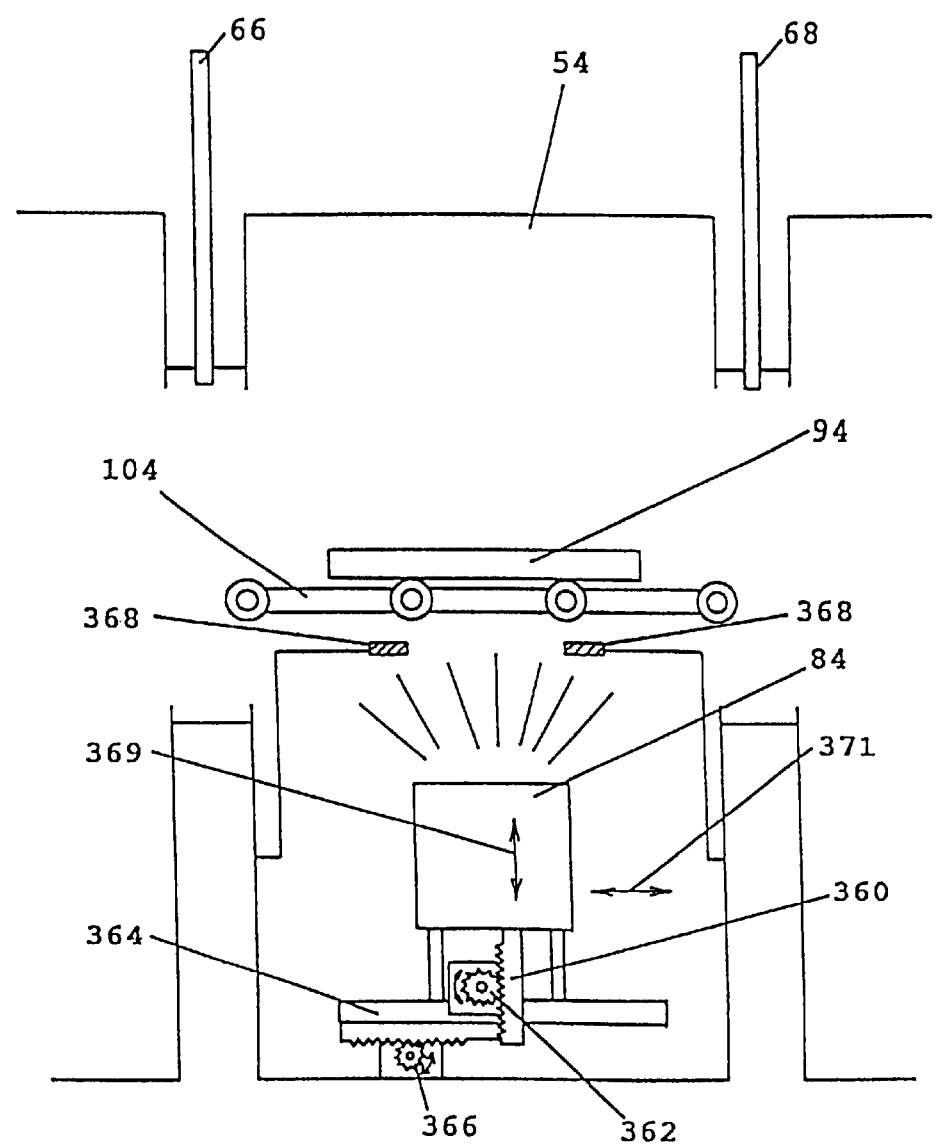
FIG. 19 is a schematic side view that shows a moving mechanism for the recording layer forming unit, which mechanism is placed in the recording film forming chamber of the device of the present invention.

In a preferred embodiment of the device of the present invention, a mechanism, which is capable of changing the positional relationship between the recording layer forming unit (in particular, the evaporation source of the pigment material) and the substrate holder or the substrate in the recording layer forming chamber, is further installed. FIG. 19 is a schematic cross-sectional view showing the recording layer forming chamber 54 of FIG. 2 having this mechanism. In the recording layer forming chamber 54 as described above, reference numeral 84 is a recording layer forming unit or an evaporation source, 360 is a vertical direction driving rack, 362 is a gear, 364 is a horizontal direction driving rack, and 366 is a gear. Since the vertical direction driving rack 360 is shifted when the gear 362 is driven, the recording layer forming unit 84 can be moved in the direction of arrow 369 with respect to the optical recording medium substrate or the substrate holder 94. Moreover, since the horizontal direction driving rack 364 is moved when the gear 366 is driven, the unit 84 can be moved in the direction of arrow 371. A film-thickness measuring device 368 is placed in the proximity of the optical recording medium substrate 28, and more preferably, a plurality of these measuring devices are installed. Thus, information of the measurements on the film thickness from these measuring devices is fed back so that the position of the evaporation source 84 with respect to the substrate holder 94 is controlled so as to achieve an optimal film forming rate and a uniform film thickness (control circuits, etc. not shown).

It is noted that in the optical recording medium manufacturing device of the present invention, where the pigment material is intermittently supplied, an electric heater is used for heating the pigment material: however, an induction heating system may also be used. In this case, an eddy current tends to occur in the measuring cup made of a metal and the resulting heat heats the pigment material, and this arrangement is free from disconnection differently than the electric heater, thereby resulting in high reliability such that it is possible to carry out the evaporation with high efficiency.

INDUSTRIAL APPLICABILITY

The device of the present invention, which is the device for manufacturing the optical recording medium having a plurality of the recording layers formed on the substrate, is provided with: the vacuum pre-treatment chamber; a plurality of the recording layer forming chambers for forming the recording layers by vapor deposition; the reflective layer forming chamber; and the vacuum post-treatment chamber. Each of the recording layer forming chambers is provided with at least one recording layer forming unit, and the reflective layer forming chamber is provided with at least one reflective layer forming unit. In accordance with this arrangement of the present invention, it is possible to stably manufacture a write-once type optical recording medium without irregularities in thickness, and also to vapor-deposit a plurality of organic pigment materials together simultaneously. Therefore, it becomes possible to follow the still-developing specifications of the optical recording medium with regard to its high density, and also to realize product specifications suitable for the optical design of the recording layers formed by the organic pigment materials that are made applicable to shortened laser wavelengths.

Moreover, with the shutter mechanism installed between the optical recording medium substrate and the recording layer forming unit, it is possible to obtain a uniform recording layer with high accuracy at high speeds, and with the film-thickness measuring device installed between the optical recording medium substrate and the recording layer forming unit, as well as with the mechanism for freely changing the distance between the optical recording medium substrate and the recording layer forming unit, it is also possible to control the state of the recording layer which is being formed with high accuracy.

Furthermore, since the optical recording medium substrate is allowed to rotate and/or revolve, upon the layer formation on the optical recording medium substrate, by virtue of the holder to which the optical recording medium substrate is attached, it is possible to realize control of the thickness of the recording layer with higher accuracy. And, since a plurality of the optical recording medium substrates are attached to the substrate holder, it is possible to mass-produce the optical disks at a low cost.

In addition, when the manufacturing device is provided with a turn table, since the order in which layers are formed in the optical recording medium can be changed as desired, it is possible to freely manufacture optical recording media having recording layers with different specifications, by only changing the setting of the layer-forming program in the device.

Moreover, the application of the low dust-generation single hand robot makes it possible to provide an optical recording medium with a low error rate, and also to greatly reduce the facility costs.

As described above, in accordance with the present invention, a write-once type optical recording medium (for example, a CD-R and a DVD-R), which is free from conventional problems, can be obtained.

In particular, since a measuring device for measuring pigment materials with high accuracy is installed in the recording layer forming unit, it is possible to achieve a constant layer thickness by adjusting the amount of the pigment material to be supplied, and consequently, to easily control the layer thickness. Moreover, with the arrangement having a plurality of the independent measuring cups, the pigment materials can be pre-heated preferably step by step. Therefore, it is possible to easily control the heating and evaporating temperatures of the pigment material, and consequently, to provide stable evaporation efficiently.

In particular, when the member for supporting the measuring cup has a thermal insulating property, heat from the heating device is transmitted to the measuring cup efficiently so that stable evaporation is provided. Furthermore, when a plurality of the independent heating devices are installed, the measuring cup can be heated step by step; and therefore, very fine temperature control is achieved, and a stable evaporation rate (speed) with a sharp rise can be obtained.

When the cooling device is provided after the heating device in the recording layer forming unit, the measuring cup which has been heated can be cooled to a proper temperature, and further, when a plurality of the cooling devices are provided, an evaporating process with higher accuracy and higher efficiency is obtained. Furthermore, in the case of the application of the induction heating system for the heating the pigment material, it becomes possible to achieve a stable heating process with a further reliability.

What is claimed is:

1. A device for manufacturing an optical recording medium having a plurality of recording layers formed on a substrate, comprising:

a vacuum pre-treatment chamber;

a plurality of recording layer forming chambers each provided with at least one recording layer forming unit for forming a recording layer by vapor deposition of an organic pigment material onto a substrate, wherein said at least one recording layer forming unit includes an organic pigment material supplying mechanism and plural heaters, with said organic pigment material supplying mechanism for intermittently supplying the organic pigment material to said plural heaters so that the organic pigment material can be successively heated and finally evaporated by said plural heaters;

a reflective layer forming chamber provided with at least one reflective layer forming unit; and a Vacuum post-treatment chamber.

2. The device according to claim 1, further comprising a substrate transporting mechanism for transporting the substrate between said vacuum pre-treatment chamber, said plurality of recording layer forming chambers, said reflective layer forming chamber and said vacuum post-treatment chamber.

3. A The device according to claim 2, wherein said substrate transporting mechanism comprises a single hand robot.

4. The device according to claim 1, wherein said vacuum pre-treatment chamber, said plurality of recording layer forming chambers, said reflective layer forming chamber and said vacuum post-treatment chamber are capable of maintaining respective predetermined pressures independently of one another, and wherein said vacuum pre-treatment chamber, said plurality of recording layer forming chambers, said reflective layer forming chamber and said vacuum post-treatment chamber are arranged in series, with a first of said plurality of recording layer forming chambers being adjacent to said vacuum pre-treatment chamber and a second of said plurality of recording layer forming chambers being adjacent to said reflective layer forming chamber, such that the substrate can be transported by a substrate transporting mechanism from said vacuum pre-treatment chamber into said first of said plurality of recording layer forming chambers in which a first recording layer is formed on the substrate via vacuum deposition, then can be transported into said second of said plurality of recording layer forming chambers in which a second recording layer is formed on the first recording layer via vacuum deposition, then can be transported into said reflective layer forming chamber in which a reflective layer is formed on the second recording layer via sputtering, and then can be transported into said post-treatment chamber.

5. The device according to claim 1, wherein said vacuum pre-treatment chamber, said plurality of recording layer forming chambers, said reflective layer forming chamber and said vacuum post-treatment chamber are arranged around a rotary chamber and in selective fluid communication with said rotary chamber, and wherein said vacuum pre-treatment chamber, said plurality of recording layer forming chambers, said reflective layer forming chamber, said vacuum post-treatment chamber and said rotary chamber are capable of maintaining respective predetermined pressures independently of one another, such that the substrate can be transported by a substrate transporting mechanism from any one of said vacuum pre-treatment chamber, said plurality of recording layer forming chambers, said reflective layer forming chamber and said vacuum post-treatment chamber to any other of said vacuum pre-treatment chamber, said plurality of recording layer forming chambers, said reflective layer forming chamber and said vacuum post-treatment chamber through said rotary chamber, whereby when the substrate is in a first of said plurality of recording layer forming chambers a first recording layer is formed on the substrate via vapor deposition, when the substrate is in a second of said plurality of recording layer forming chambers a second recording layer is formed on the first recording layer via vapor deposition, and when the substrate is in said reflective layer forming chamber a reflective layer is formed on the second recording layer via sputtering.

6. The device according to claim 1, further comprising a shutter mechanism to be positioned between said at least one recording layer forming unit and the substrate when the organic pigment material is being vapor deposited onto the substrate.

7. The device according to claim 1, further comprising a mechanism to rotate the substrate about an axis of the substrate, or revolve the substrate about an axis offset from the substrate, within at least one of said plurality of recording layer forming chambers.

8. The device according to claim 1, further comprising a mechanism to change the positional relationship between said at least one recording layer forming unit and the substrate when the substrate is in one of said plurality of recording layer forming chambers.

9. The device according to claim 1, further comprising a device to continuously or intermittently measure a thickness of the recording layer vapor deposited onto the substrate in one of said plurality of recording layer forming chambers.

10. The device according to claim 1, wherein said organic pigment material supplying mechanism includes a plurality of independent measuring cups into which the organic pigment material is to be supplied.

11. The device according to claim 10, wherein said organic pigment material supplying mechanism further includes a weighing device to measure a weight of the organic pigment material supplied to each of said plurality of independent measuring cups.

12. The device according to claim 1, further comprising at least one cooling device provided downstream of said plural heaters.

13. The device according to claim 1, wherein said plural heaters comprise induction heaters.

14. A device for manufacturing an optical recording medium having a plurality of recording layers formed on a substrate, comprising:
   a vacuum pre-treatment chamber;
   a plurality of recording layer forming chambers each provided with at least one recording layer forming unit for forming a recording layer by vapor deposition of an organic pigment material onto a substrate, wherein said at least one recording layer forming unit includes an organic pigment material supplying mechanism having a plurality of independent measuring cups into which the organic pigment material is to be supplied such that the organic pigment material can be intermittently supplied by said independent measuring cups to a heating and evaporating mechanism;
   a reflective layer forming chamber provided with at least one reflective layer forming unit; and
   a vacuum post-treatment chamber.

15. The device according to claim 14, wherein said organic pigment material supplying mechanism further has a weighing device to measure a weight of the organic pigment material supplied to each of said plurality of independent measuring cups.

16. The device according to claim 14, further comprising a substrate transporting mechanism for transporting the substrate between said vacuum pre-treatment chamber, said plurality of recording layer forming chambers, said reflective layer forming chamber and said vacuum post-treatment chamber.

17. The device according to claim 16, wherein said substrate transporting mechanism comprises a single hand robot.

18. The device according to claim 14, wherein said vacuum pre-treatment chamber, said plurality of recording layer forming chambers, said reflective layer forming chamber and said vacuum post-treatment chamber are capable of maintaining respective predetermined pressures independently of one another, and
   wherein said vacuum pre-treatment chamber, said plurality of recording layer forming chambers, said reflective layer forming chamber and said vacuum post-treatment chamber are arranged in series, with a first of said plurality of recording layer forming chambers being adjacent to said vacuum pre-treatment chamber and a second of said plurality of recording layer forming chambers being adjacent to said reflective layer forming chamber, such that the substrate can be transported by a substrate transporting mechanism from said vacuum pre-treatment chamber into said first of said plurality of recording layer forming chambers in which a first recording layer is formed on the substrate via vacuum deposition, then can be transported into said second of said plurality of recording layer forming chambers in which a second recording layer is formed on the first recording layer via vacuum deposition, then can be transported into said reflective layer forming chamber in which a reflective layer is formed on the second recording layer via sputtering, and then can be transported into said post-treatment chamber.

19. The device according to claim 14, wherein said vacuum pre-treatment chamber, said plurality of recording layer forming chambers, said reflective layer forming chamber and said vacuum post-treatment chamber are arranged around a rotary chamber and in selective fluid communication with said rotary chamber, and
   wherein said vacuum pre-treatment chamber, said plurality of recording layer forming chambers, said reflective layer forming chamber, said vacuum post-treatment chamber and said rotary chamber are capable of maintaining respective predetermined pressures independently of one another, such that the substrate can be transported by a substrate transporting mechanism from any one of said vacuum pre-treatment chamber, said plurality of recording layer forming chambers, said reflective layer forming chamber and said vacuum post-treatment chamber to any other of said vacuum pre-treatment chamber, said plurality of recording layer forming chambers, said reflective layer forming chamber and said vacuum post-treatment chamber through said rotary chamber, whereby when the substrate is in a first of said plurality of recording layer forming chambers a first recording layer is formed on the substrate via vapor deposition, when the substrate is in a second of said plurality of recording layer forming chambers a second recording layer is formed on the first recording layer via vapor deposition, and when the substrate is in said reflective layer forming chamber a reflective layer is formed on the second recording layer via sputtering.

20. The device according to claim 14, further comprising a shutter mechanism to be positioned between said at least one recording layer forming unit and the substrate when the organic pigment material is being vapor deposited onto the substrate.

21. The device according to claim 14, further comprising a mechanism to rotate the substrate about an axis of the substrate, or revolve the substrate about an axis offset from the substrate, within at least one of said plurality of recording layer forming chambers.

22. The device according to claim 14, further comprising a mechanism to change the positional relationship between said at least one recording layer forming unit and the substrate when the substrate is in one of said plurality of recording layer forming chambers.

23. The device according to claim 14, further comprising a device to continuously or intermittently measure a thickness of the recording layer vapor deposited onto the substrate in one of said plurality of recording layer forming chambers.

24. A method for manufacturing an optical recording medium, comprising:
   in a first recording layer forming chamber, successively supplying an organic pigment material to plural heaters so that said organic pigment material becomes successively heated and finally evaporated, and then vapor depositing the evaporated organic pigment material onto a substrate to form a first recording layer on said substrate;
   in a second recording layer forming chamber, vapor depositing an organic pigment material onto said first recording layer to form a second recording layer on said first recording layer; and in a reflective layer forming chamber, forming a reflective layer on said second recording layer.

25. The method according to claim 24, wherein the vapor depositing of an organic pigment material onto said first recording layer to form a second recording layer on said first recording layer includes successively supplying an organic pigment material to plural heaters so that said organic pigment material becomes successively heated and finally evaporated, and then vapor depositing the evaporated organic pigment material onto said first recording layer.

26. The method according to claim 25, further comprising:

transporting said substrate into a vacuum pre-treatment chamber;

transporting said substrate from said vacuum pre-treatment chamber into said first recording layer forming chamber;

transporting said substrate having said first recording layer thereon from said first recording layer forming chamber into said second recording layer forming chamber;

transporting said substrate having said first recording layer and said second recording layer thereon from said second recording layer forming chamber into said reflective layer forming chamber;

transporting said substrate having said first recording layer, said second recording layer and said reflective layer thereon from said reflective layer forming chamber into a vacuum post-treatment chamber; and removing said substrate having said first recording layer, said second recording layer and said reflective layer thereon from said vacuum post-treatment chamber.

27. A method for manufacturing an optical recording medium, comprising:

in a first recording layer forming chamber,
supplying a first portion of an organic pigment material into a cup, supplying said cup to a heating and vaporizing mechanism so that said first portion of said organic pigment material in said cup becomes heated and evaporated, and then vapor depositing the evaporated first portion of said organic pigment material onto a substrate, and supplying a second portion of said organic pigment material into another cup, supplying said another cup to said heating and vaporizing mechanism so that said second portion of said organic pigment material in said another cup becomes heated and evaporated, and then vapor depositing the evaporated second portion of said organic pigment material onto said substrate, whereby the vapor deposited first portion and vapor deposited second portion of said organic pigment material form a first recording layer on said substrate;

in a second recording layer forming chamber, vapor depositing an organic pigment material onto said first recording layer to form a second recording layer on said first recording layer; and in a reflective layer forming chamber, forming a reflective layer on said second recording layer.

28. The method according to claim 27, wherein supplying a first portion of an organic pigment material into a cup and supplying a second portion of said organic pigment material into another cup includes intermittently supplying said first portion and said second portion of said organic pigment material into said cup and said another cup.

29. The method according to claim 28, wherein the vapor depositing of an organic pigment material onto said first recording layer to form a second recording layer on said first recording layer includes:

supplying a first amount of an organic pigment material into a cup, supplying said cup to a heating and vaporizing mechanism so that said first amount of said organic pigment material in said cup becomes heated and evaporated, and then vapor depositing the evaporated first amount of said organic pigment material onto said first recording layer; and then supplying a second amount of said organic pigment material into another cup, supplying said another cup to a heating and vaporizing mechanism so that said second amount of said organic pigment material in said another cup becomes heated and evaporated, and then vapor depositing the evaporated second amount of said organic pigment material onto said first recording layer, whereby the vapor deposited first amount and vapor deposited second amount of said organic pigment material form a second recording layer on said first recording layer.

30. The method according to claim 29, wherein supplying a first amount of an organic pigment material into a cup and supplying a second amount of said organic pigment material into another cup includes intermittently supplying said first amount and said second amount of said organic pigment material into said cup and said another cup.

31. The method according to claim 30, further comprising:

transporting said substrate into a vacuum pre-treatment chamber;

transporting said substrate from said vacuum pre-treatment chamber into said first recording layer forming chamber;

transporting said substrate having said first recording layer thereon from said first recording layer forming chamber into said second recording layer forming chamber;

transporting said substrate having said first recording layer and said second recording layer thereon from said second recording layer forming chamber into said reflective layer forming chamber;

transporting said substrate having said first recording layer, said second recording layer and said reflective layer thereon from said reflective layer forming chamber into a vacuum post-treatment chamber; and removing said substrate having said first recording layer, said second recording layer and said reflective layer thereon from said vacuum post-treatment chamber.

* * * * *